US011509269B2

(12) United States Patent
Ryu et al.

(10) Patent No.: US 11,509,269 B2
(45) Date of Patent: Nov. 22, 2022

(54) RADIO FREQUENCY (RF) AMPLIFIER BIAS CIRCUIT

(71) Applicant: QUALCOMM INCORPORATED, San Diego, CA (US)

(72) Inventors: Jisun Ryu, Sudbury, MA (US); Yan Kit Gary Hau, Westford, MA (US); Guoqing Fu, Medford, MA (US); Xinwei Wang, Dunstable, MA (US); Xiangdong Zhang, Westford, MA (US); Chenliang Du, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 142 days.

(21) Appl. No.: 16/995,468

(22) Filed: Aug. 17, 2020

(65) Prior Publication Data

US 2022/0052656 A1    Feb. 17, 2022

(51) Int. Cl.
*H03F 1/30* (2006.01)
*H03F 3/21* (2006.01)

(52) U.S. Cl.
CPC ......... *H03F 3/21* (2013.01); *H03F 2200/171* (2013.01); *H03F 2200/294* (2013.01); *H03F 2200/451* (2013.01)

(58) Field of Classification Search
CPC .................................. H03F 1/30; H03F 3/191
USPC .......................................... 330/296, 285, 302
See application file for complete search history.

(56) References Cited

U.S. PATENT DOCUMENTS

| 9,660,589 | B2* | 5/2017 | Kondo | .................. | H03F 1/0227 |
| 10,263,566 | B1* | 4/2019 | Laighton | ................ | H03F 3/213 |
| 10,498,291 | B2* | 12/2019 | Tsai | ....................... | H03F 3/245 |
| 2019/0068124 | A1 | 2/2019 | Tsai | | |

FOREIGN PATENT DOCUMENTS

EP    1548536 A1    6/2005

OTHER PUBLICATIONS

Hsiao Y-H., et al., "A V-Band Power Amplifier with Adaptive Bias Circuit to Save Quiescent DC Power Consumption Using 90-nm CMOS Technology," 2014 Asia-Pacific Microwave Conference, IEICE, Nov. 4, 2014 (Nov. 4, 2014), XP032750487, pp. 157-159, [retrieved on Mar. 25, 2015], p. 157, left-hand column, line 14-p. 159, right-hand column, line 8, figures 1-7.

(Continued)

*Primary Examiner* — Henry Choe
(74) *Attorney, Agent, or Firm* — Smith Tempel Blaha LLC/Qualcomm

(57) ABSTRACT

An amplifier circuit includes an amplifier configured to receive a radio frequency (RF) input signal from an input node, a bias circuit comprising a reference transistor coupled between a reference current source and ground, and a bias transistor coupled to the reference transistor and configured to generate a main bias current to bias the amplifier, an input power sense circuit coupled to the input node, and an additional transistor coupled to the input power sense circuit and to the bias transistor, the additional transistor configured to generate an additional bias current to bias the amplifier, the additional bias current responsive to a power level of the RF input signal.

19 Claims, 16 Drawing Sheets

(56) References Cited

OTHER PUBLICATIONS

International Search Report and Written Opinion—PCT/US2021/042866—ISA/EPO—dated Oct. 15, 2021.
Taniguchi E., et al., "A Dual Bias-Feed Circuit Design for SiGe HBT Low-Noise Linear Amplifier", IEEE Transactions on Microwave Theory and Techniques, Plenum, USA, vol. 51, No. 2, Feb. 1, 2003, XP011076896, pp. 414-421, ISSN: 0018-9480, p. 414, left-hand column, line 23-p. 421, left-hand column, line 4, figures 1-12.

* cited by examiner

RADIO FREQUENCY (RF) AMPLIFIER BIAS CIRCUIT

FIELD

The present disclosure relates generally to electronics, and more specifically to bias circuits for power amplifiers.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier paths having one or more stages that may include one or more driver stages, one or more power amplifier stages, and one or more impedance matching circuits. The one or more driver stages and the one or more power amplifier stages may be biased for desired operation using one or more bias circuits. The amplifier circuit or circuits may generally be called upon to provide different levels of power amplification over a wide bandwidth, while attempting to provide both efficiency and linearity for a variety of different transmission signals. Often, providing a linear power output comes at the expense of efficiency, and providing a power output at high efficiency comes at the expense of linearity.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier circuit having an amplifier configured to receive a radio frequency (RF) input signal from an input node, a bias circuit comprising a reference transistor coupled between a reference current source and ground, and a bias transistor coupled to the reference transistor and configured to generate a main bias current to bias the amplifier, an input power sense circuit coupled to the input node, and an additional transistor coupled to the input power sense circuit and to the bias transistor, the additional transistor configured to generate an additional bias current to bias the amplifier, the additional bias current responsive to a power level of the RF input signal.

Another aspect of the disclosure provides a method for communication including providing a main bias signal to an amplifier, determining a strength of a radio frequency (RF) input signal, generating a supplemental bias signal based on the strength of the RF input signal; and biasing the amplifier using the main bias signal and the supplemental bias signal.

Another aspect of the disclosure provides a device including means for amplifying, means for providing a main bias signal to the means for amplifying, means for determining a strength of a radio frequency (RF) input signal, means for generating a supplemental bias signal based on the strength of the RF input signal, and means for biasing the means for amplifying using the main bias signal and the supplemental bias signal.

Another aspect of the disclosure provides a circuit, including an amplifier comprising a first transistor, a collector of the first transistor coupled to an output of the amplifier, an emitter of the first transistor coupled to ground, and a base of the first transistor coupled to a source of a radio frequency input signal, a bias circuit comprising a second transistor, a collector of the second transistor coupled to a first voltage source, and an emitter of the second transistor coupled to the base of the first transistor, and a third transistor, a collector of the third transistor coupled to the first voltage source, an emitter of the third transistor coupled to the base of the first transistor, and a base of the third transistor coupled to the source of the radio frequency input signal.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
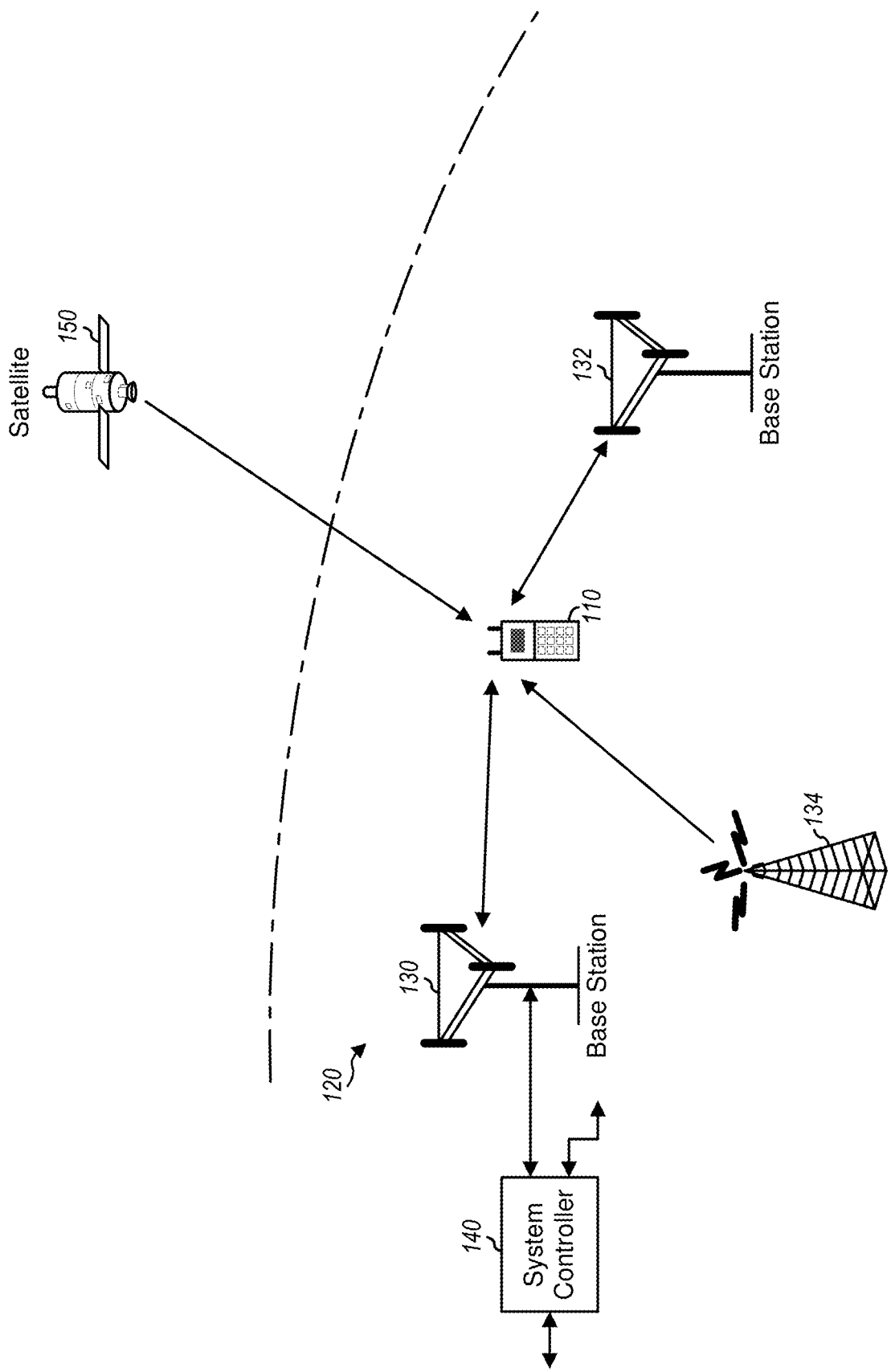
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a bias circuit for a radio frequency (RF) amplifier, for example a driver amplifier or a power amplifier. The bias circuit can be configured in a variety of different configurations to provide a bias signal to a driver amplifier or a power amplifier. In exemplary embodiments, the bias circuit may be configured to adjust the driver amplifier or power amplifier bias point to increase (or maximize) one or more of the amplifier's gain, power and linearity. In an exemplary embodiment, the bias circuit may be configured to adjust the driver amplifier or power amplifier bias point based at least in part on the strength of the RF signal to be amplified.

As portable communication systems evolve, the market continues to demand higher spectral efficiency (i.e., information rate transmitted over a given bandwidth). A high spectral efficiency demands linear output power over a large PAPR (peak to average power ratio) from an amplifier, and in particular, from a power amplifier. The latest 4G and 5G communication standards define some mobile devices as high power user equipment (HPUE), which may be configured to exploit improved cellular network coverage and reliability, and provide increased data rate and increased overall capacity using higher transmitted power. In addition, the ever-increasing desire for a mobile device to support global roaming with a compact form-factor demands that the mobile device have a complex radio frequency (RF) front-end architecture, which often comes at a higher insertion loss, further increasing the output power demanded from the power amplifier in the mobile device. In one example, the output power, Pout, may be increased by lowering the load impedance of the power amplifier (PA). For example, for a power amplifier operated in average power tracking (APT) mode with a boost regulator providing up to about 5.5V and targeting a power output (Pout)>36 dBm at the collector plane, the load impedance will be <2 ohm. However, the effectiveness of such low load impedance in facilitating such high power output may be diminished due to an increase in output matching loss. Further, for a power amplifier implemented using bipolar junction transistor (BJT) technology, the power output (Pout) is typically limited by the available base voltage/current where some type of base feedback is usually employed to ensure the thermal stability of the BJT device. Existing technology may overcome this problem with solutions designed to minimize the impact of base feedback and therefore achieve high Pout without sacrificing thermal behavior of the BJT device.

In a typical BJT power transistor, as the RF input power of the signal to be amplified increases, the rectified voltage at the base of the power transistor (the base-to-emitter junction voltage, $V_{BE}$) decreases. This bias operation behavior may cause one or more of a reduction in gain, lower saturation output power, (Psat), and AM/AM (amplitude modulation-to-amplitude modulation) distortion. Therefore, it would be desirable to dynamically control or maintain, and in some applications increase or decrease the base voltage of a BJT transistor device used as an amplifier.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a drone, a vehicle, a wearable device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
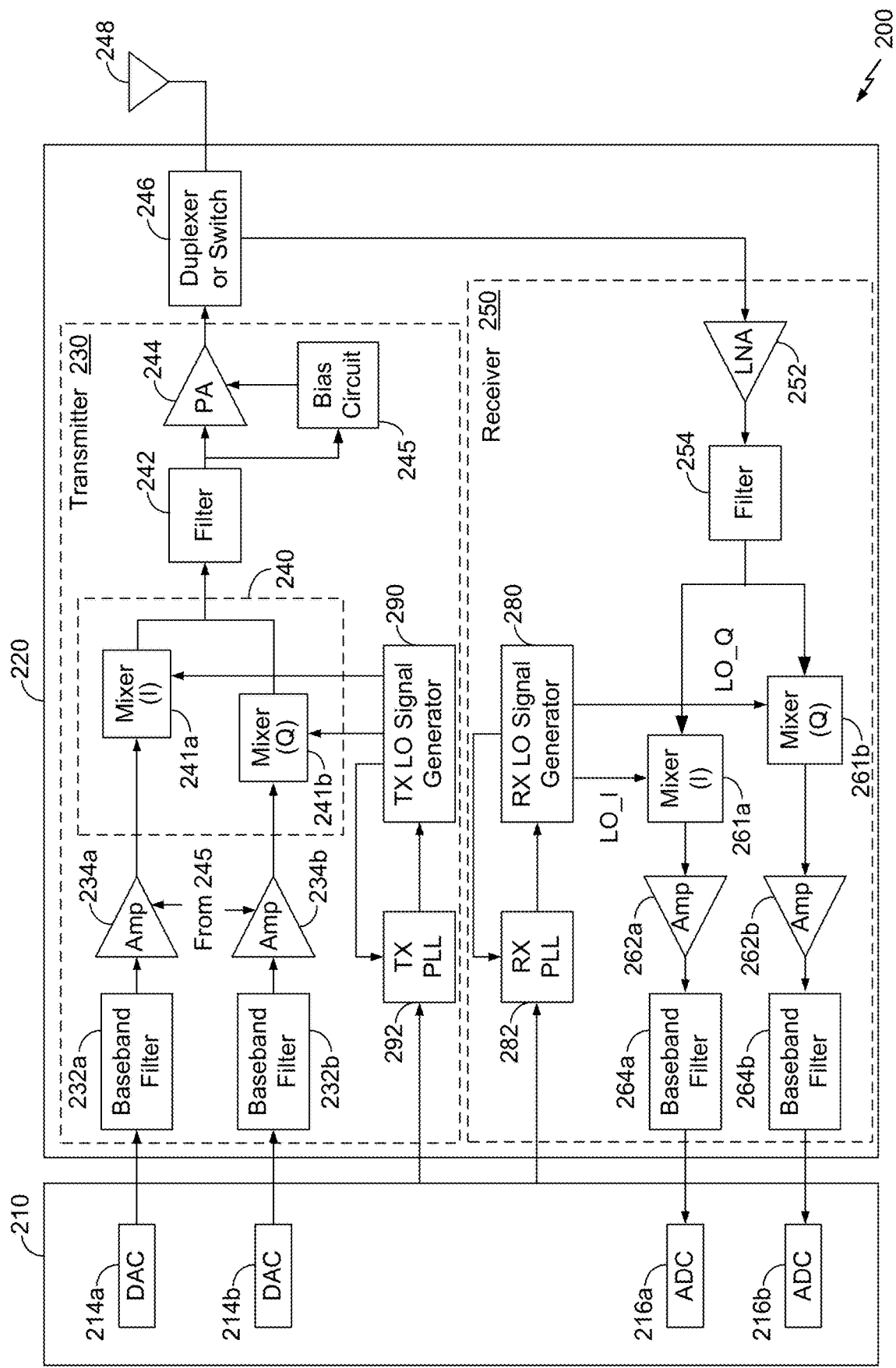
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1.

FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises a transceiver 220 and a data processor 210. The data processor 210 may include a memory (not shown) to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In an exemplary embodiment, the wireless device 200 may include a bias circuit 245. The bias circuit 245 is shown as being in the transmitter 230 and providing a bias signal to the power amplifier 244 for example purposes only. However, instances of the bias circuit 245 may also be configured to provide a bias signal to other amplifiers, such as the amplifiers 234a and 234b, or other amplifiers in the wireless device 200. In an exemplary embodiment, the bias circuit 245 can include elements that can be configured to receive a portion of the RF input signal, for example, from the input of the power amplifier 244, or the output of the filter 242, and develop a control signal used to at least partially control the output of the power amplifier 244, or the output of the amplifier 234a, and/or the amplifier 234b, based at least in part on the signal strength of the RF input signal. Further, some or all components of the bias circuit 245 may be located elsewhere, such as elsewhere within the transmitter 230, within the power amplifier 244, within the data processor 210, or elsewhere in the wireless device 200. In some embodiments, the bias circuit 245 may be implemented in a chip including a microcontroller; the chip may be mounted on a PCB on which other transmitter 230 elements, or RF front end elements (e.g., the duplexer or switch 246, filter 242 or 254, or other non-illustrated elements) are mounted and the microcontroller may be used to adjust the power amplifier 244, the amplifier 234a, the amplifier 234b, and/or one or more of the other front end elements. In some embodiments, the bias circuit 245 is implemented on the same IC and/or within the same module as the power amplifier 244.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. In some embodiments, the LNA 252, the power amplifier 244, the bias circuit 245, and one or more filters (e.g., the filter 242 and/or 254) and/or switches may be implemented together in a single module. In other embodiments, one or more of these elements may be implemented separate from a module or IC in which another of the elements is implemented.

Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, good efficiency, or a combination of good linearity and good efficiency. Other output stages may be implemented in the power amplifier 244 instead of or in addition to the stages recited above.

In an exemplary embodiment of the present disclosure, an amplifier bias circuit may be responsive to a power level of an RF input signal and may be incorporated with or into the amplifiers 234a and 234b, and/or may be incorporated with or into the power amplifier 244 to provide RF power amplification. Those of skill in the art, however, will recognize that aspects of the amplifier bias circuit described herein may be implemented in transmit architectures which differ from the architecture illustrated in FIG. 2 and may be implemented in other devices in which RF power amplification is desired.

It is generally desirable for a power amplifier circuit to provide linear power amplification over a desired bandwidth, which may be a wide bandwidth, support high data rate transmission, provide high efficiency over the desired power output range and bandwidth, and support multiple power modes.

Figure 3:
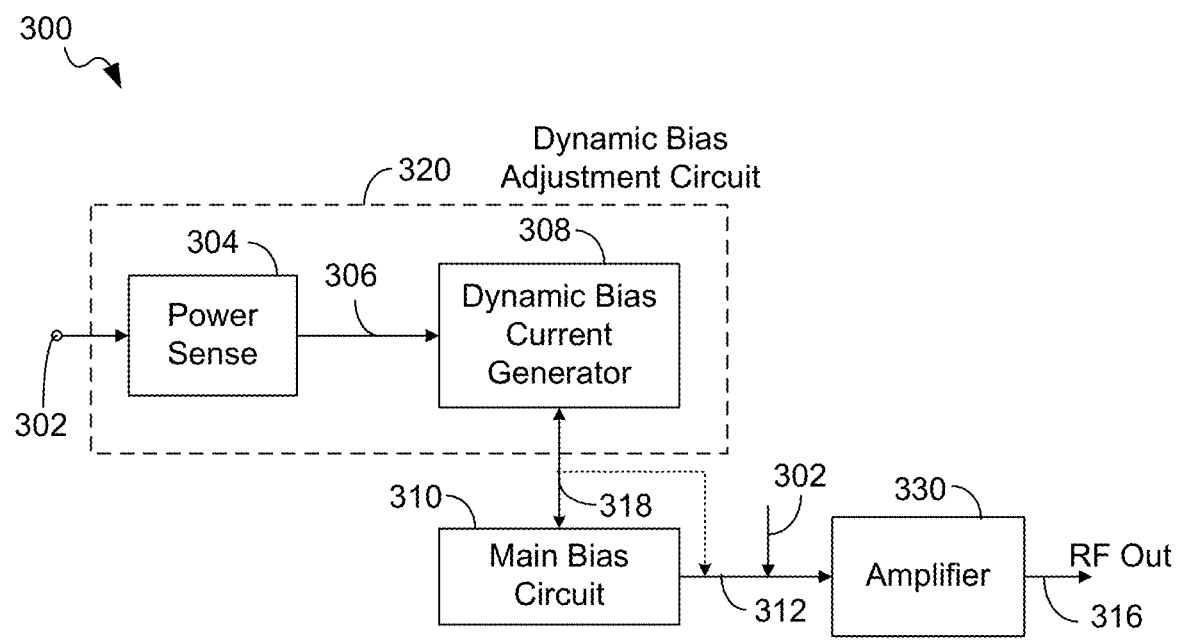
FIG. 3 is a schematic diagram illustrating an amplifier circuit in accordance with an exemplary embodiment of the disclosure.

FIG. 3 is a schematic diagram illustrating an amplifier circuit 300 in accordance with an exemplary embodiment of the disclosure. The amplifier circuit 300 may, for example, be an embodiment of or may be included within certain implementations of the power amplifier 244 and/or bias circuit 245 illustrated in FIG. 2, may be included within certain implementations of the amplifiers 234a and/or 234b illustrated in FIG. 2, or may be included within or associated with another amplifier, such as a driver amplifier (not shown) that may be included in the transmitter 230 of FIG. 2.

In an exemplary embodiment, the amplifier circuit 300 comprises a main bias circuit 310, a dynamic bias adjustment circuit 320, and an amplifier 330. In an exemplary embodiment, the dynamic bias adjustment circuit 320 comprises a power sense circuit 304 and a dynamic bias current generator 308. While not explicitly illustrated, it will be understood that the main bias circuit 310 may be configured to be dynamic and/or adjustable as well (e.g., in addition to or independently of the dynamic bias adjustment circuit 320).

An RF input signal (RF_in) may be provided over a radio frequency (RF) input terminal 302 to the power sense circuit 304. The power sense circuit 304 detects and determines a power level associated with the RF input signal on connection 302, and provides a signal representing the power level associated with the RF input signal over connection 306 to the dynamic bias current generator 308. For example, the power sense circuit 304 may detect a voltage level of the RF input signal on connection 302 and provide a signal representative of the detected voltage level on connection 306.

The main bias circuit 310 is coupled to the dynamic bias current generator 308 over connection 318. The main bias circuit 310 provides an initial bias signal over connection 312 to the amplifier 330. The amplifier 330 amplifies the RF input signal on connection 302 at least in part based on the bias signal on connection 312, and provides an RF output signal over connection 316. In an exemplary embodiment, the dynamic bias adjustment circuit 320 may provide an additional or supplemental bias signal to the main bias circuit 310, or optionally (shown in dotted line), to an output 312 of the main bias circuit 310, over connection 318, and the main bias circuit 310 may provide the initial bias signal and the additional or supplemental bias signal over connection 312 to the amplifier 330.

Figure 4:
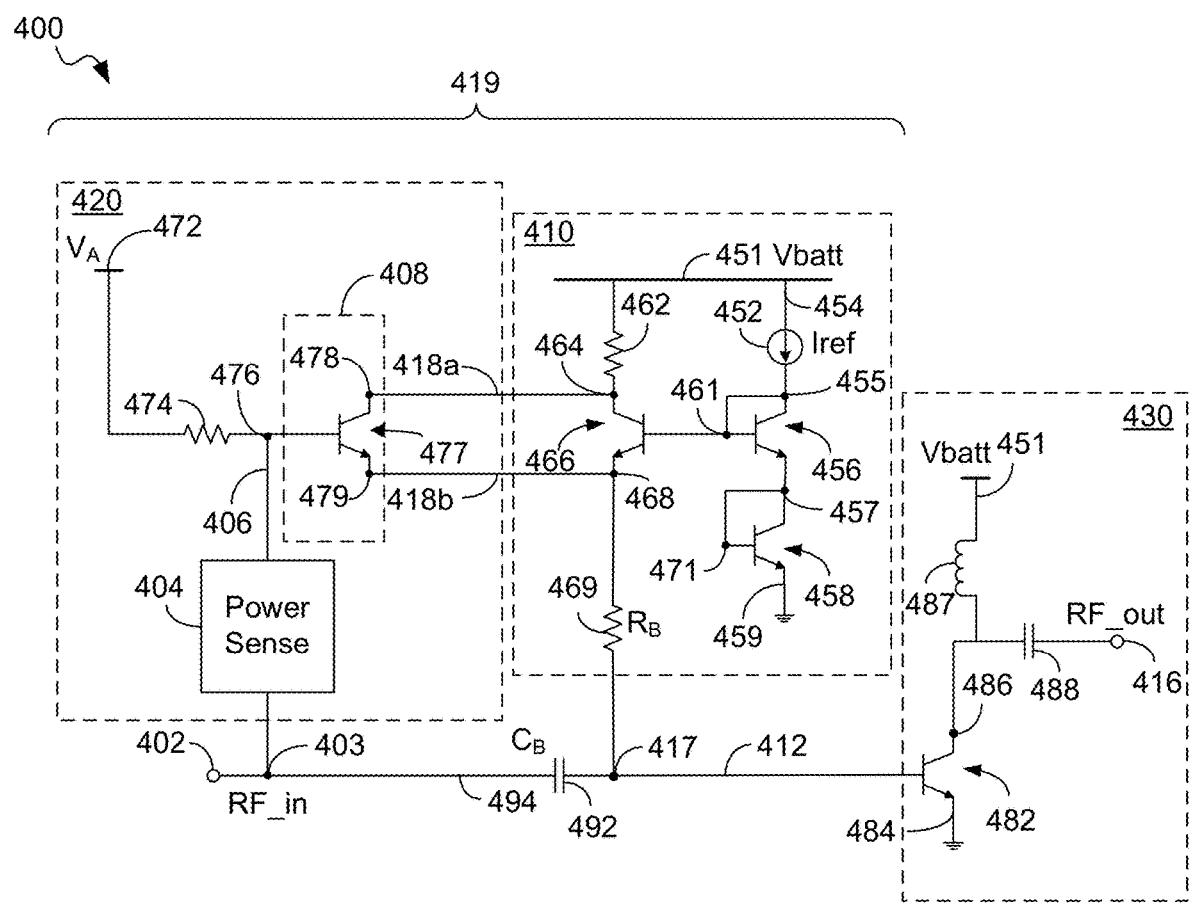
FIG. 4 is a schematic diagram illustrating an exemplary embodiment of an amplifier circuit in accordance with an exemplary embodiment of the disclosure.

FIG. 4 is a schematic diagram illustrating an exemplary embodiment of an amplifier circuit 400. The amplifier circuit 400 of FIG. 4 is an example implementation of the amplifier circuit 300 of FIG. 3. Elements in FIG. 4 that are similar to corresponding elements in FIG. 3 will be labeled using the nomenclature 4XX, where an element in FIG. 4 labeled 4XX is similar to an element in FIG. 3 labeled 3XX. For example, the dynamic bias adjustment circuit 420 in FIG. 4 is similar to, and is an exemplary embodiment of the dynamic bias adjustment circuit 320 in FIG. 3.

In an exemplary embodiment, the amplifier circuit 400 comprises a main bias circuit 410, a dynamic bias adjustment circuit 420, and an amplifier 430. The main bias circuit 410 and the dynamic bias adjustment circuit 420 together comprise a bias circuit 419. The example amplifier circuit 400 is illustrated in FIG. 4 as being fabricated using BJT technology.

In an exemplary embodiment, the main bias circuit 410 comprises a current source 452 and a current mirror formed by transistors 456 and 466. The main bias circuit 410 may further comprise transistor 458, which may be connected as a diode. The current source 452 is coupled to a battery voltage, Vbatt, 451 over connection 454. In an exemplary embodiment, the voltage Vbatt may be an unregulated voltage provided by a battery or other power source, or in other exemplary embodiments may be a regulated voltage. The current source 452 is also coupled to the collector of the transistor 456 at the node 455. The emitter of the transistor 456 is coupled to the collector of the transistor 458 at node 457 in the illustrated embodiment. The emitter of the transistor 458 is coupled to system ground. The node 457 is coupled to the base of the transistor 458 at the node 471. The collector of the transistor 456 at the node 455 is coupled to the base of the transistor 456 at the node 461, which is also coupled to the base of the transistor 466. The base of the transistor 466 is therefore coupled to the base of the transistor 456 at the node 461. The signal at node 461 biases the transistor 466. The current source 452 may be referred to as a reference current source and the transistors 456 and 458 may be referred to as reference transistors. The transistor 466 may be referred to as a bias transistor.

The collector of the transistor 466 is coupled via the node 464 to the battery voltage, Vbatt, 451 through a resistor 462.

The emitter of the transistor 466 is coupled via the node 468 to a resistor 469. In an exemplary embodiment, the resistor 469 may also be referred to as a "bias" or "ballast" resistor, $R_B$. The resistor 469 is also coupled to a node 417, which is coupled to the base of the transistor 482 on connection 412. The signal at the node 417 and the connection 412 biases the base of the transistor 482. In some embodiments, the main bias circuit 410 (or 310) is configured as a buffer, for example as an emitter follower. Those of skill in the art will appreciate that the configuration of the main bias circuit 410 illustrated in FIG. 4 is an example, and that other configurations of the bias circuit 410 and 310 may be implemented. In some alternate configurations, additional transistors (which may be connected as diodes, for example) may be selectively coupled to the current source 452 to vary or limit a bias provided to the transistor 482 by the main bias circuit 410 (or 310) based on the battery voltage 451. Yet other configurations of the main bias circuit 410 (or 310) may also be implemented.

The dynamic bias adjustment circuit 420 comprises a power sense circuit 404. In an exemplary embodiment, the power sense circuit 404 may be implemented as any RF coupled path and may be configured to receive the RF input signal over node 403, which is coupled to the RF input node 402. In an exemplary embodiment, the power sense circuit 404 may be implemented as an RF coupled path, which may comprise one or more of a direct shorted electrical connection, a capacitance, an inductance, a resistance, or a combination of one or more of a capacitance, an inductance, and a resistance.

In an exemplary embodiment, the dynamic bias adjustment circuit 420 comprises a dynamic bias current generator 408 implemented using a transistor 477. A base of the transistor 477 may be coupled to a voltage, $V_A$, 472 through a resistor 474 at the node 476. The voltage, $V_A$, at node 472 may be an arbitrary voltage determined by the desired operating characteristics of the transistor 477. In an exemplary embodiment, the value of $V_A$ is related to the amount of current that the transistor 477 is designed to produce. The base of the transistor 477 may also be coupled to the power sense circuit 404 over connection 406 via the node 476. In an exemplary embodiment, the transistor 477 may be coupled to the transistor 466. For example, the collector of the transistor 477 may be coupled to the node 478, and may be coupled to the collector of the transistor 466 at the node 464 over connection 418a. In an exemplary embodiment, the emitter of the transistor 477 may be coupled to the node 479, and may be coupled to the emitter of the transistor 466 at the node 468 over connection 418b.

In an exemplary embodiment, the amplifier 430 comprises a transistor 482. The base of the transistor 482 may be coupled to connection 412. The collector of the transistor 482 at the node 486 may be coupled to the battery voltage, Vbatt, 451 through an inductor 487. The collector of the transistor 482 may also be coupled to an RF output node 416 through a capacitor 488. A capacitor 492 may be coupled between the RF input on connection 402 via connection 494 and the base of the transistor 482 on connection 412. In an exemplary embodiment, the capacitor 492 may also be referred to as a "bias" or "ballast" capacitor, $C_B$. Those of skill in the art will appreciate that other configurations of the amplifier 430 (or 330) may be implemented. For example, one or more of the reactances in the amplifier 430 (or 330) or coupled to the amplifier 430 (or 330) may be omitted.

In an exemplary embodiment, the amplifier circuit 400 may be configured to control the instantaneous variation of the bias current provided to the base of the transistor 482 on connection 412 as a function of the strength of the RF input signal on connection 402, which varies with the signal envelope. In an exemplary embodiment, the power sense circuit 404 may be used to detect and determine the instantaneous strength of the RF input signal at connection 402. The output of the power sense circuit 404 is provided over connection 406 to the node 476, which is coupled to the base of the transistor 477. The transistor 477 then generates current from its collector at node 478 to its emitter at node 479 based, at least in part, on the detected instantaneous RF input signal strength at its base at node 476 and supplies this current as additional or supplemental bias current to the node 468, across the resistor 469, and to the node 417, which can be connected to the base of the transistor 482 over connection 412. This additional bias current provided to the node 417 adjusts the operating point (bias point) of the transistor 482 in the amplifier 420 at least in part based on the instantaneous strength of the RF signal at the node 403, and allows the transistor 482 to provide one or more of higher gain or less AM/AM distortion, and may also allow the transistor 482 to provide a higher output power (Psat), thus leading to the amplifier 430 achieving a higher maximum linear output power, $P_{OUT}$, than if the dynamic bias current generator 408 being responsive to the signal strength of the RF input signal were not implemented.

In an exemplary embodiment, the voltage representing the detected RF input signal provided to the base of the transistor 477 at the node 476 will be rectified by the base-emitter junction of the transistor 477 such that the transistor 477 generates a current at the emitter at the node 479 that varies according to the envelope of the RF input signal at the node 403. As the voltage level of the input signal, $RF_{IN}$, at node 403 increases, the voltage at the node 476 increases, and the current rectified by the transistor 477 also increases, thus providing additional bias current to the base of the transistor 482 via the node 417 and the connection 412. The current added to connection 412 by the transistor 477 can allow the transistor 482 to supply additional base-emitter current ($I_{BE}$) so as to compensate for the voltage drop across the resistor 469, and the resulting base-emitter voltage drop ($V_{BE}$) that would occur in the transistor 482 as the strength (the voltage) of the input signal (RF in) increases. Therefore, the additional or supplemental bias current provided by the transistor 477 may allow the transistor 482 to provide additional power as the level of the RF input signal on connection 402 increases.

Figure 5:
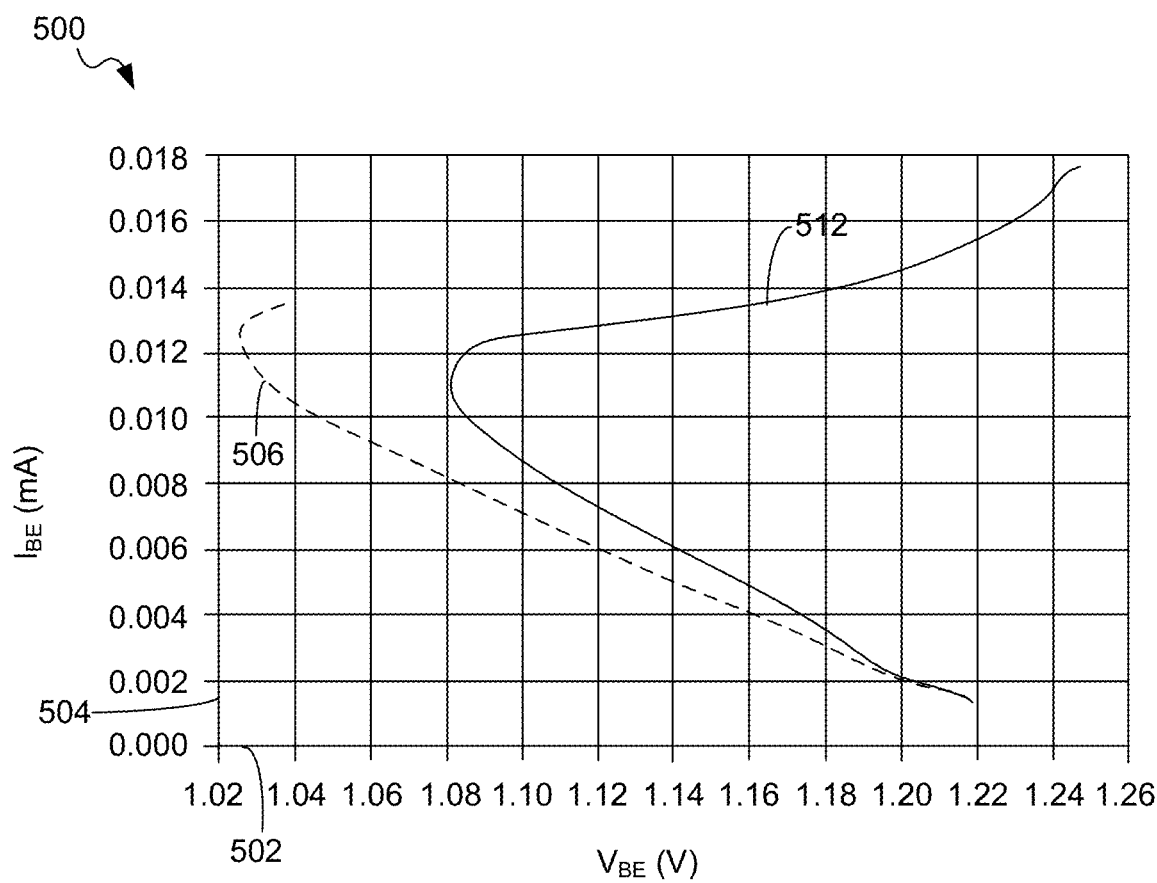
FIG. 5 is a graph showing an example of the effect of the operation of the amplifier circuit of FIG. 4.

FIG. 5 is a graph 500 showing an example of the effect of the operation of the amplifier circuit 400 of FIG. 4. The horizontal axis 502 shows the base-emitter voltage ($V_{BE}$) of the transistor 482 of FIG. 4 and the vertical axis 504 shows the base-emitter current ($I_{BE}$) of the transistor 482 of FIG. 4.

The trace 506 shows the relationship between the base-emitter current ($I_{BE}$) and the base-emitter voltage ($V_{BE}$) of the transistor 482 (FIG. 4), as the input power of the RF input signal varies in an amplifier circuit that does not include the power sense circuit 404 and the dynamic bias current generator 408 of FIG. 4. As the power level of the RF input signal increases, the base-emitter voltage ($V_{BE}$) of the transistor 482 decreases and the base-emitter current ($I_{BE}$) of the transistor 482 increases.

The trace 512 shows the relationship between the base-emitter current ($I_{BE}$) and the base-emitter voltage ($V_{BE}$) of the transistor 482 (FIG. 4), as the input power of the RF input signal varies in the embodiment of the amplifier circuit 400 of FIG. 4, which includes the power sense circuit 404 and the dynamic bias current generator 408 of FIG. 4.

As shown when comparing the trace 512 with the trace 506, as the input power of the RF input signal increases, there is additional base-emitter current ($I_{BE}$) available via the dynamic bias adjustment circuit 420 (FIG. 4) to increase the bias point of the transistor 482 in the amplifier 430 (FIG. 4), resulting in a higher base-emitter voltage, $V_{BE}$, at the base-emitter junction of the transistor 482 in the amplifier 430 for a given base-emitter current.

The additional bias current made available to the transistor 482 by the dynamic bias adjustment circuit 420 as the input power of the RF input signal increases allows the transistor 482 to provide a higher saturated power output (Psat), by maintaining the base-emitter voltage ($V_{BE}$) of the transistor 482 under high base-emitter current ($I_{BE}$) operation, without altering the load impedance presented to the transistor 482.

In an exemplary embodiment, the additional bias current made available to the transistor 482 by the dynamic bias adjustment circuit 420 improves the linearity performance of the transistor 482.

In an exemplary embodiment, the additional bias current made available to the transistor 482 by the dynamic bias adjustment circuit 420 can compensate for the above-mentioned voltage drop across the resistor 469, allowing the value of the resistor 469 to remain relatively high, which may promote thermal stability.

In an exemplary embodiment, the dynamic bias adjustment circuit 420 (FIG. 4) is self-contained and/or can be integrated onto the same power amplifier die (e.g., gallium arsenide (GaAs) or gallium nitride (GaN)) as the amplifier 430.

In an exemplary embodiment, the dynamic bias adjustment circuit 420 (FIG. 4) is scalable, where scaling the size and coupling factor of the transistor 477 and/or $V_A$ can adjust the operating region of the transistor 477.

In an exemplary embodiment, the dynamic bias adjustment circuit 420 (FIG. 4) can support large bandwidth operation.

Figure 6:
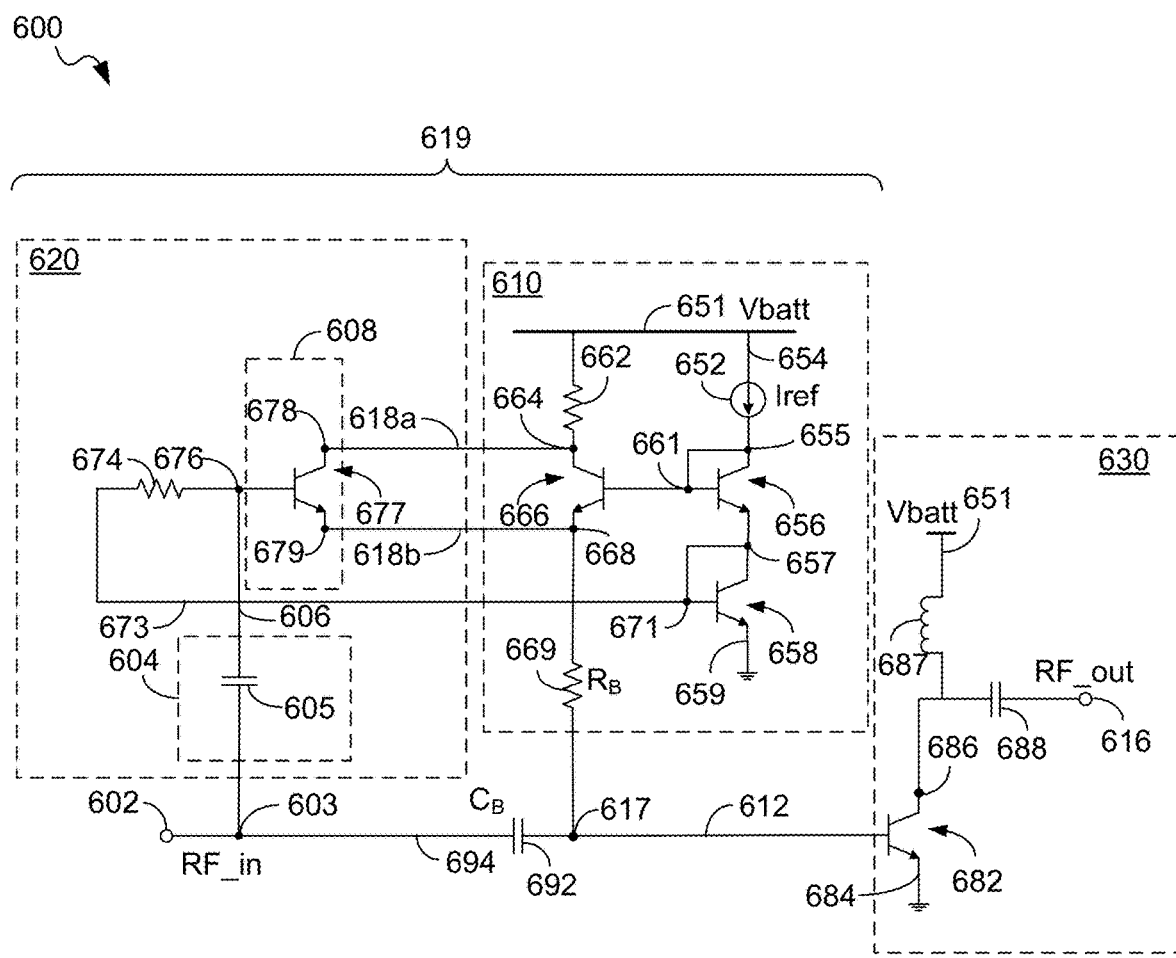
FIG. 6 is a schematic diagram illustrating an exemplary embodiment of an amplifier circuit in accordance with an exemplary embodiment of the disclosure.

FIG. 6 is a schematic diagram illustrating an exemplary embodiment of an amplifier circuit 600. The amplifier circuit 600 of FIG. 6 is an example implementation of the amplifier circuit 300 of FIG. 3 and the amplifier circuit 400 of FIG. 4. Elements in FIG. 6 that are similar to corresponding elements in FIG. 3 and FIG. 4 will be labeled using the nomenclature 6XX, where an element in FIG. 6 labeled 6XX is similar to an element in FIG. 3 labeled 3XX or an element in FIG. 4 labeled 4XX. For example, the dynamic bias adjustment circuit 620 in FIG. 6 is similar to, and is an exemplary embodiment of, the dynamic bias adjustment circuit 320 in FIG. 3 and the dynamic bias adjustment circuit 420 in FIG. 4.

In FIG. 6, the power sense circuit 604 is implemented using a capacitance 605 configured to receive the RF input signal on connection 602. The capacitance 605 is coupled to the node 676 at the base of the transistor 677 and to the RF input signal at node 603. In an exemplary embodiment, a resistor 674 may be coupled over connection 673 to the base of the transistor 658 at the node 671.

The bias voltage at the node 676 at the base of the transistor 677 is one factor that determines the amount of DC current that will be generated by the transistor 677. As the voltage at node 676 increases, for example, when the RF input signal at node 603 increases, the transistor 677 generates proportionally more DC current at its emitter at the node 679. If the voltage at node 676 decreases, the transistor 677 generates proportionately less DC current at its emitter at the node 679. The optimum DC current generated by the transistor 677 depends on a number of factors, including the size of the transistor 677, the sizes of the other transistors in the circuit 600, the particular implementation, etc. In the example shown in FIG. 6, the voltage at node 676 (the DC bias voltage of the transistor 677) is the same as the base-emitter junction forward bias voltage of the transistor 658.

In the implementation of FIG. 4, where the resistor 474 is coupled to a voltage, $V_A$, generating an arbitrary voltage $V_A$ is sometimes challenging because it may use a dedicated voltage source or circuit. However, the circuit of FIG. 6 uses the existing node 671 to provide the DC bias voltage for the transistor 677, thus eliminating the need to generate the voltage, $V_A$, and thus simplifying the amplifier circuit 600. Moreover, this also reduces the amount of area occupied by the components of the circuit 600.

Figure 7:
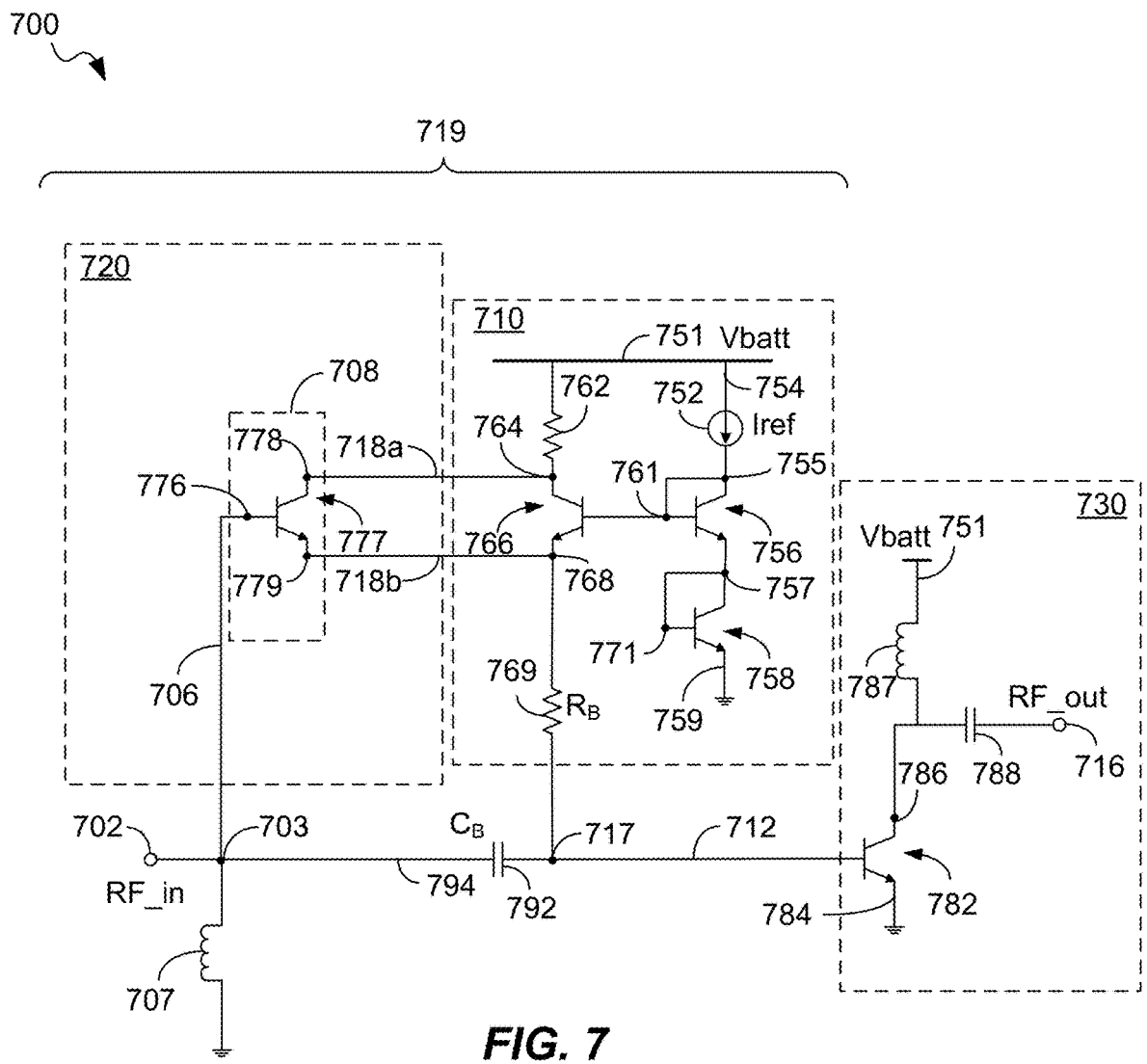
FIG. 7 is a schematic diagram illustrating an exemplary embodiment of an amplifier circuit in accordance with an exemplary embodiment of the disclosure.

FIG. 7 is a schematic diagram illustrating an exemplary embodiment of an amplifier circuit 700. The amplifier circuit 700 of FIG. 7 is an example implementation of the amplifier circuit 300 of FIG. 3 and the amplifier circuit 400 of FIG. 4. Elements in FIG. 7 that are similar to corresponding elements in FIG. 3 and FIG. 4 will be labeled using the nomenclature 7XX, where an element in FIG. 7 labeled 7XX is similar to an element in FIG. 3 labeled 3XX or an element in FIG. 4 labeled 4XX. For example, the dynamic bias adjustment circuit 720 in FIG. 7 is similar to, and is an exemplary embodiment of, the dynamic bias adjustment circuit 320 in FIG. 3 and the dynamic bias adjustment circuit 420 in FIG. 4.

In FIG. 7, the power sense circuit 304 (FIG. 3) and 404 (FIG. 4) is implemented using a direct shorted connection, where the base of the transistor 777 at the node 776 is coupled directly to the RF input on connection 702 over connection 706. An inductor 707 is also coupled between the node 703 and system ground.

In the exemplary amplifier circuit 700, the base of the transistor 777 at the node 776 is biased using a ground reference (e.g., zero volts) through the inductor 707 at the node 703, thus eliminating the capacitor, 605 (FIG. 6), and the resistor, 674 (FIG. 6). Biasing the base of the transistor 777 at the node 776 using a zero-volts ground reference at the node 703 is accomplished by having the node 703 at zero volts DC for a part of the input signal cycle. The signal at node 703 has a fluctuating voltage because it is the RF input signal. However, the average value of the signal at node 703 is zero VDC, so that the bias signal on connection 776 is zero VDC. In addition, the inductor 707 and the capacitor 792 may function as part of a matching circuit for the transistor 782.

Figure 8:
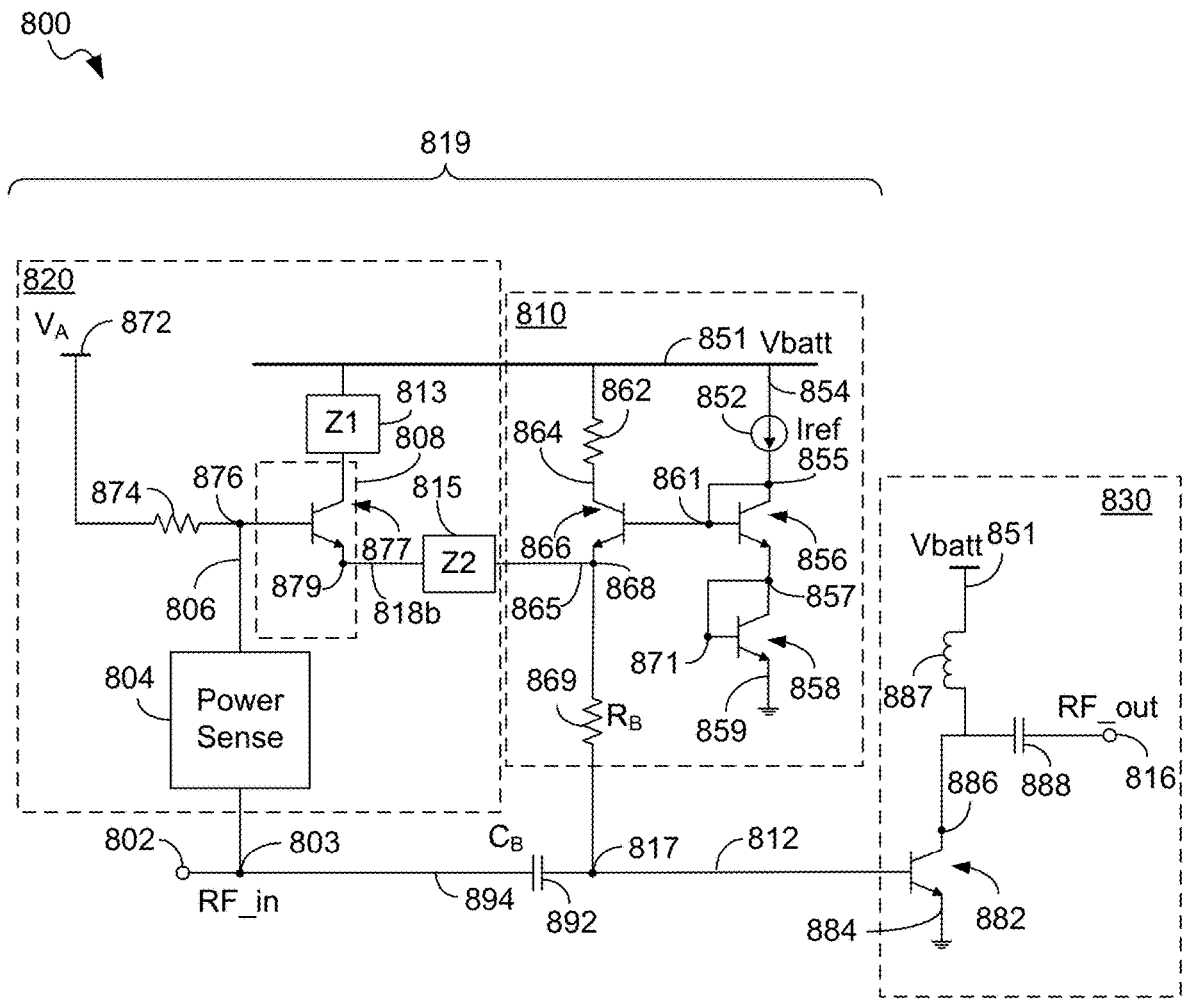
FIG. 8 is a schematic diagram illustrating an exemplary embodiment of an amplifier circuit in accordance with an exemplary embodiment of the disclosure.

FIG. 8 is a schematic diagram illustrating an exemplary embodiment of an amplifier circuit 800. The amplifier circuit 800 of FIG. 8 is an example implementation of the amplifier circuit 300 of FIG. 3 and the amplifier circuit 400 of FIG. 4. Elements in FIG. 8 that are similar to corresponding elements in FIG. 3 and FIG. 4 will be labeled using the nomenclature 8XX, where an element in FIG. 8 labeled 8XX is similar to an element in FIG. 3 labeled 3XX or an element in FIG. 4 labeled 4XX. For example, the dynamic bias adjustment circuit 820 in FIG. 8 is similar to, and is an exemplary embodiment of the dynamic bias adjustment circuit 320 in FIG. 3 and the dynamic bias adjustment circuit 420 in FIG. 4.

In FIG. 8, the power sense circuit 804 is implemented using any RF coupled path and may be coupled to the base of the transistor 877 at node 876 over connection 806 and may be coupled to the node 803. The power sense circuit 804 may be configured to receive the RF input signal on connection 802. A resistor 874 may also be coupled to the node 876 and may be coupled to a voltage, $V_A$, on connection 872.

In the exemplary embodiment shown in FIG. 8, the collector of the transistor 877 may be coupled to the battery voltage, Vbatt, on connection 851 through a first impedance element 813. The emitter of the transistor 877 may be coupled over connection 818b to a second impedance element 815. The second impedance element 815 may be coupled to the emitter of the transistor 866 over connection 865. In the exemplary embodiment of FIG. 8, the impedance element 813 and the impedance element 815 may include one or more of a resistive component, an inductive component, or a capacitive component, or a combination thereof, coupled in parallel or in series and configured to adjust the DC current generated by the transistor 877. In the embodiment shown in FIG. 8, the second impedance element 815 is coupled in series between the emitter of the transistor 877 and the emitter of the transistor 866.

Figure 9:
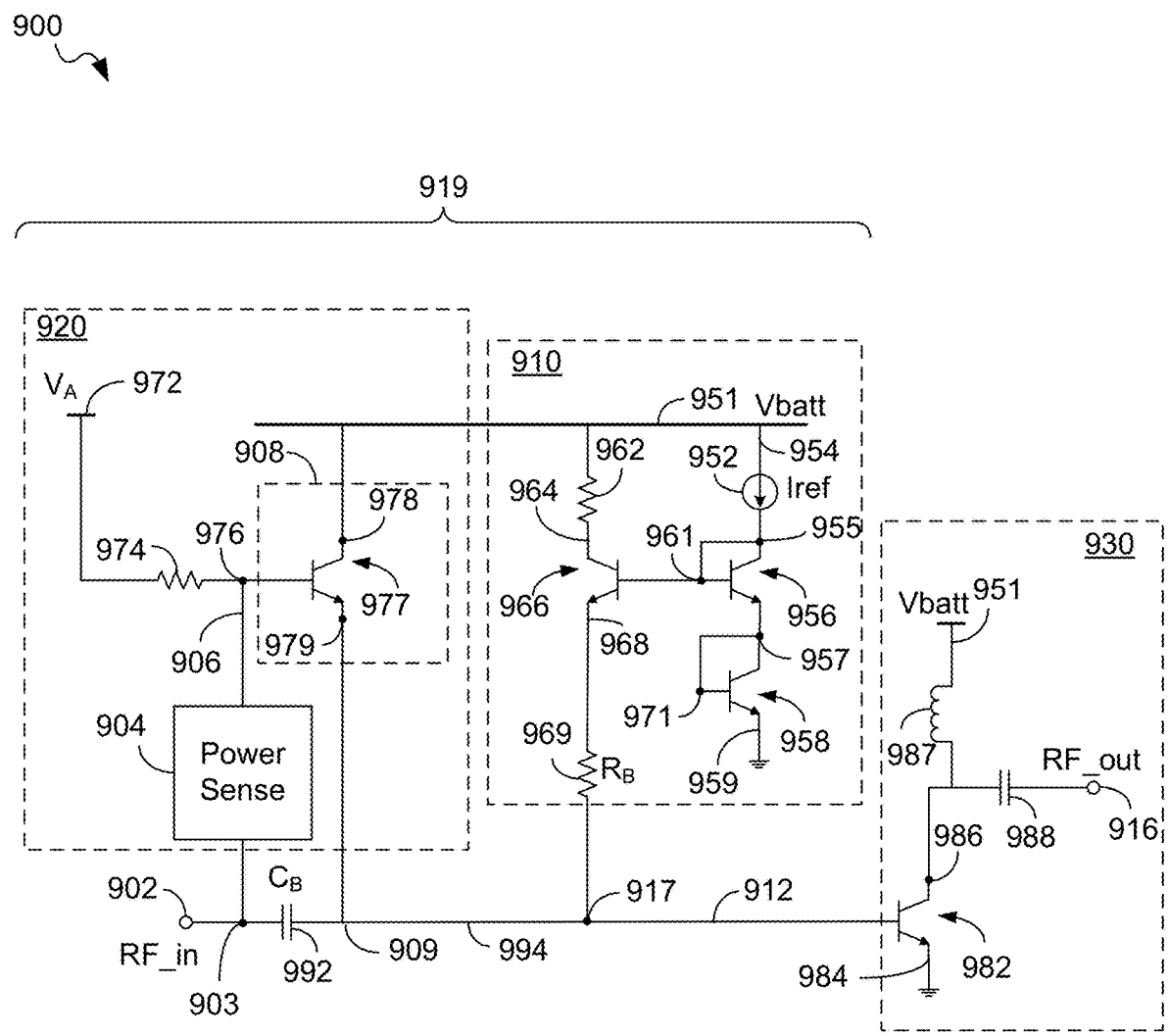
FIG. 9 is a schematic diagram illustrating an exemplary embodiment of an amplifier circuit in accordance with an exemplary embodiment of the disclosure.

FIG. 9 is a schematic diagram illustrating an exemplary embodiment of an amplifier circuit 900. The amplifier circuit 900 of FIG. 9 is an example implementation of the amplifier circuit 300 of FIG. 3 and the amplifier circuit 400 of FIG. 4. Elements in FIG. 9 that are similar to corresponding elements in FIG. 3 and FIG. 4 will be labeled using the nomenclature 9XX, where an element in FIG. 9 labeled 9XX is similar to an element in FIG. 3 labeled 3XX or an element in FIG. 4 labeled 4XX. For example, the dynamic bias adjustment circuit 920 in FIG. 9 is similar to, and is an exemplary embodiment of the dynamic bias adjustment circuit 320 in FIG. 3 and the dynamic bias adjustment circuit 420 in FIG. 4.

In FIG. 9, the power sense circuit 904 is implemented using any RF coupled path and may be coupled to the base of the transistor 977 at node 976 over connection 906 and may be coupled to the node 903 and may be configured to receive the RF input signal on connection 902. A resistor 974 may also be coupled to the node 976 and may be coupled to a voltage, $V_A$, on connection 972 (as illustrated) or to the base of the transistor 958 for example.

In the exemplary embodiment shown in FIG. 9, the collector of the transistor 977 may be coupled to the battery voltage, Vbatt, on connection 951. The emitter of the transistor 977 may be coupled to the node 909. In the exemplary embodiment of FIG. 9, the transistor 977 and the transistor 966 do not share the ballast resistor 969. In this exemplary embodiment, the transistor 966 provides the main bias current to the base 912 of the transistor 982, and the ballast resistor 969 may provide thermal stability. The transistor 977 generates bias current from its collector at node 978 to its emitter at node 979 based, at least in part, on the detected instantaneous RF input signal strength at its base and supplies this additional or supplemental bias current to the node 909, which is connected to the base of the transistor 982 over connection 912.

Figure 10:
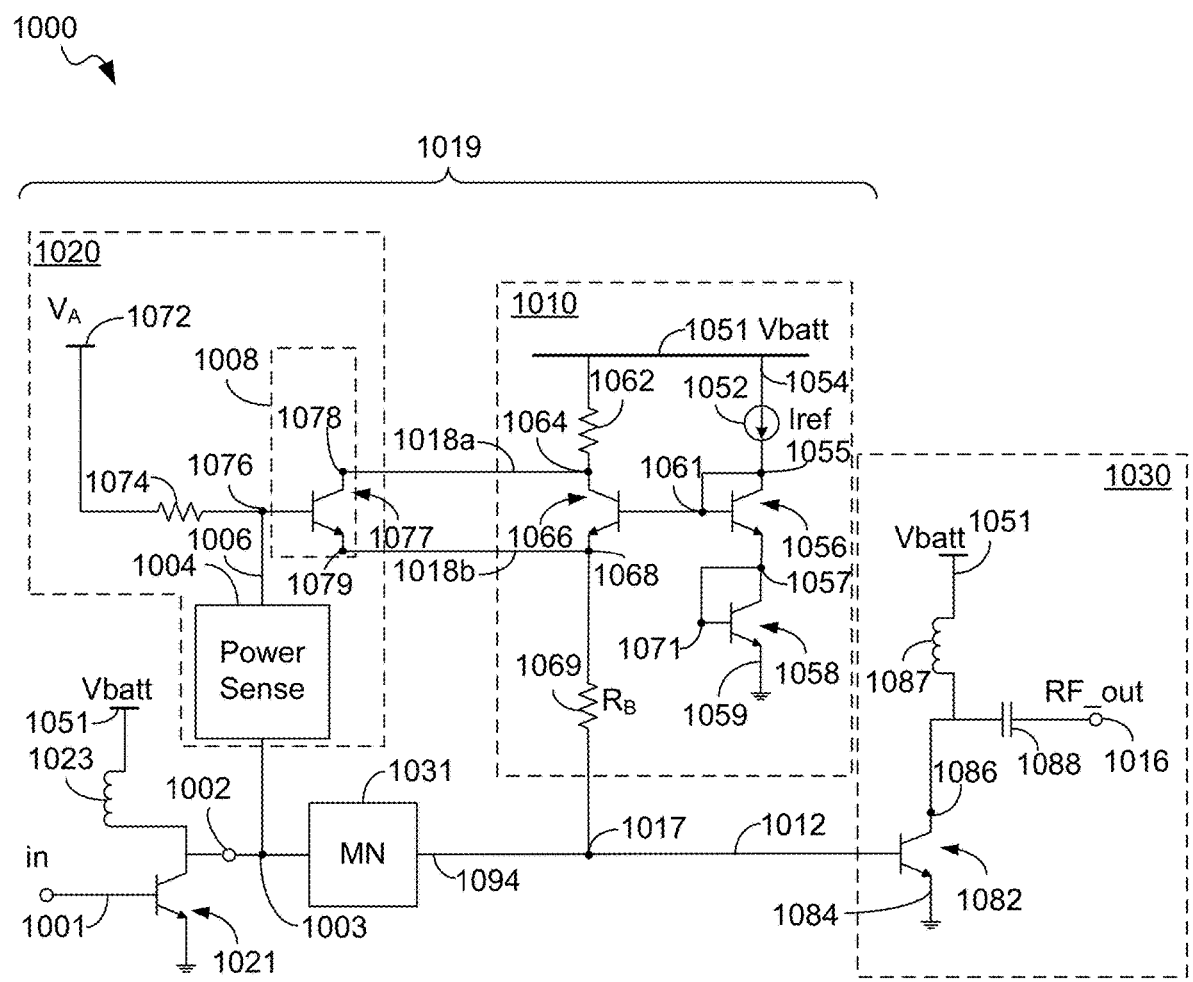
FIG. 10 is a schematic diagram illustrating an exemplary embodiment of an amplifier circuit in accordance with an exemplary embodiment of the disclosure.

FIG. 10 is a schematic diagram illustrating an exemplary embodiment of an amplifier circuit 1000. The amplifier circuit 1000 of FIG. 10 is an example implementation of the amplifier circuit 300 of FIG. 3 and the amplifier circuit 400 of FIG. 4. Elements in FIG. 10 that are similar to corresponding elements in FIG. 3 and FIG. 4 will be labeled using the nomenclature 10XX, where an element in FIG. 10 labeled 10XX is similar to an element in FIG. 3 labeled 3XX or an element in FIG. 4 labeled 4XX. For example, the dynamic bias adjustment circuit 1020 in FIG. 10 is similar to, and is an exemplary embodiment of the dynamic bias adjustment circuit 320 in FIG. 3 and the dynamic bias adjustment circuit 420 in FIG. 4.

In FIG. 10, the power sense circuit 1004 is implemented using any RF coupled path and may be coupled to the base of the transistor 1077 at node 1076 and may be coupled to the node 1003. A resistor 1074 may also be coupled to the node 1076 and may be coupled to a voltage, $V_A$, on connection 1072 (as illustrated) or to the base of the transistor 1058, for example.

In the example shown in FIG. 10, an input signal 1001, "in", is provided to the base of a transistor 1021. The RF input node 1002 is provided at the collector of the transistor 1021. The collector of the transistor 1021 is also coupled to the battery voltage, Vbatt 1051 through an inductor 1023. The collector of the transistor 1021 is also coupled to the node 1003. In this exemplary embodiment, the transistor 1021 represents a previous amplifier stage, such as, for example, an intermediate amplifier or a driver amplifier stage having an input signal, in, that may be a radio frequency (RF) signal. In some embodiments, the previous amplifier stage is implemented using the same process, for example on the same (e.g., GaAs or GaN) die as the amplifier 1030. Further, the previous amplifier may itself be preceded by one or more other amplifier stages. In some embodiments, the RF input node 1002 may be selectively or continuously coupled to a plurality of previous amplifier stages. In some embodiments, elements other than a previous amplifier stage may be coupled to the RF input node 1002. For example, a mixer may be configured to receive an input signal, in, that is a baseband or intermediate frequency signal and the mixer may have an output coupled to the RF input node 1002. As another example, a phase shifter may be configured to receive an input signal, in, and have an output coupled to the RF input node 1002.

In the exemplary embodiment shown in FIG. 10, a matching network 1031 is coupled between the node 1003 and the connection 1094. In an exemplary embodiment, the matching network 1031 may comprise one or more capacitors or inductors, or a combination thereof, coupled in series, parallel, or a combination of series and parallel. In the exemplary embodiment shown in FIG. 10, the power sense element 1004 is coupled to the node 1003 prior to the matching network 1031. In the example shown in FIG. 10, a separate ballast capacitor, $C_B$, (FIGS. 4 and FIGS. 6-9) may be omitted and its functionality included in the matching network 1031.

Figure 11:
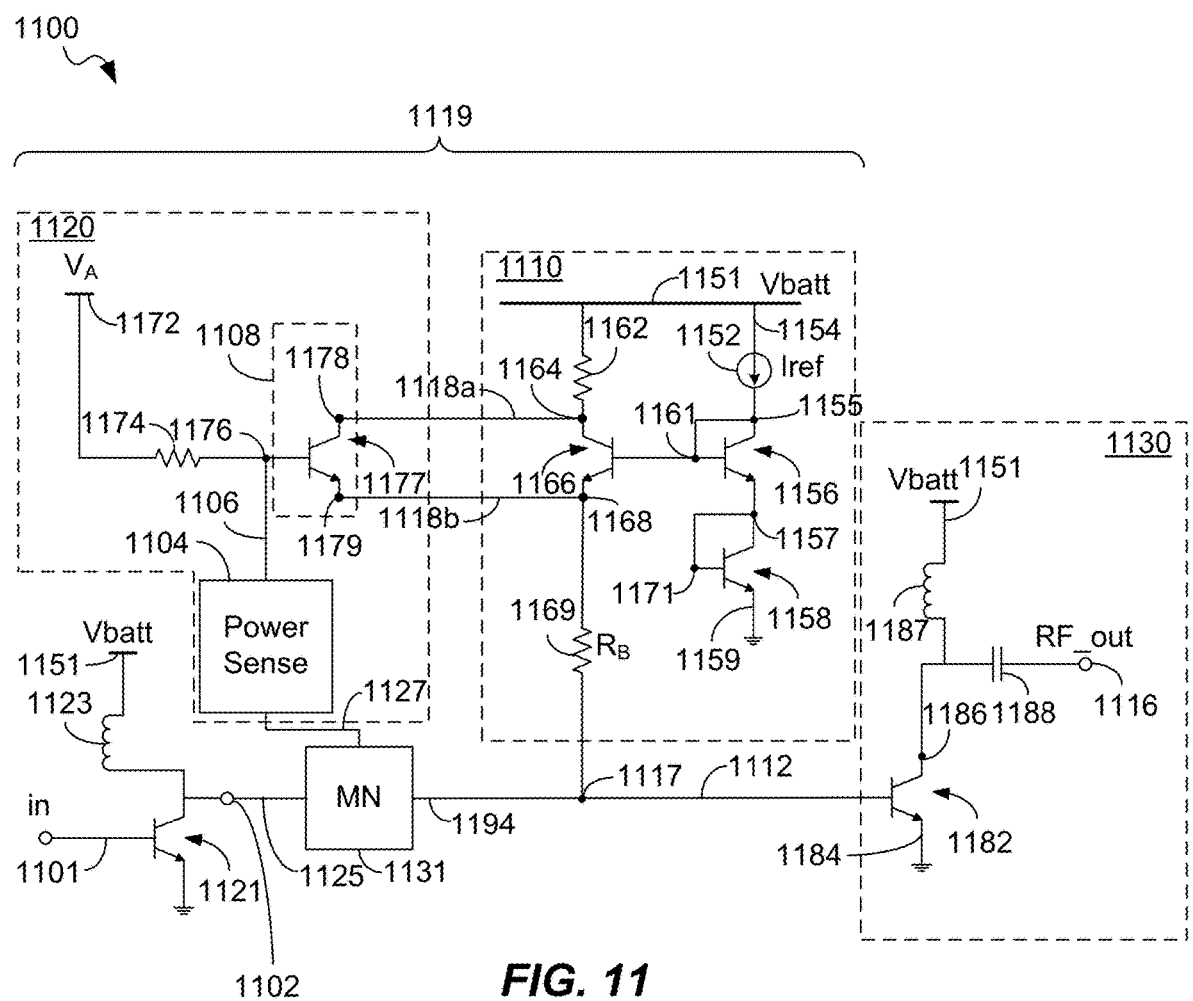
FIG. 11 is a schematic diagram illustrating an exemplary embodiment of an amplifier circuit in accordance with an exemplary embodiment of the disclosure.

FIG. 11 is a schematic diagram illustrating an exemplary embodiment of an amplifier circuit 1100. The amplifier circuit 1100 of FIG. 11 is an example implementation of the amplifier circuit 300 of FIG. 3, the amplifier circuit 400 of FIG. 4 and the amplifier circuit 1000 of FIG. 10. Elements in FIG. 11 that are similar to corresponding elements in FIG. 3, FIG. 4 and FIG. 10 will be labeled using the nomenclature 11XX, where an element in FIG. 11 labeled 11XX is similar to an element in FIG. 3 labeled 3XX, an element in FIG. 4 labeled 4XX or an element in FIG. 10 labeled 10XX. For example, the dynamic bias adjustment circuit 1120 in FIG. 11 is similar to, and is an exemplary embodiment of the dynamic bias adjustment circuit 320 in FIG. 3, the dynamic bias adjustment circuit 420 in FIG. 4 and the dynamic bias adjustment circuit 1020 in FIG. 10.

In FIG. 11, the power sense circuit 1104 is implemented using any RF coupled path and may be coupled to the base of the transistor 1177 at node 1176 and may be coupled to a matching network 1131. A resistor 1174 may also be coupled to the node 1176 and may be coupled to a voltage, $V_A$, on connection 1172 (as illustrated) or to the base of the transistor 1158, for example.

In the example shown in FIG. 11, an input signal 1101, "in", is provided to the base of a transistor 1121. The RF input node 1102 is provided at the collector of the transistor 1121. The collector of the transistor 1121 is also coupled to the battery voltage, Vbatt 1151 through an inductor 1123. The collector of the transistor 1121 is also coupled to the connection 1125, which also forms the input to the matching network 1131. In this exemplary embodiment, the transistor 1121 represents a previous amplifier stage, such as, for example, an intermediate amplifier or a driver amplifier stage, as mentioned herein. In some embodiments, the previous amplifier stage is implemented using the same process, for example on the same (e.g., GaAs or GaN) die as the amplifier 1130.

An output of the matching network 1131 may be provided over connection 1194 to the base of the transistor 1182. In the exemplary embodiment shown in FIG. 11, the connection 1127 to the matching network 1131 illustrates an example of the power sense circuit 1104 being coupled to an internal node (e.g., a mid-point) of the matching network 1131. In an exemplary embodiment, the matching network 1131 may comprise one or more capacitors or inductors, or a combination thereof, coupled in series, parallel, or a combination of series and parallel. In the exemplary embodiment shown in FIG. 11, the power sense element 1104 is coupled to the matching network 1131. In the example shown in FIG. 11, a separate ballast capacitor, $C_B$, (FIGS. 4 and FIGS. 6-9) may be omitted and its functionality included in the matching network 1131.

Figure 12:
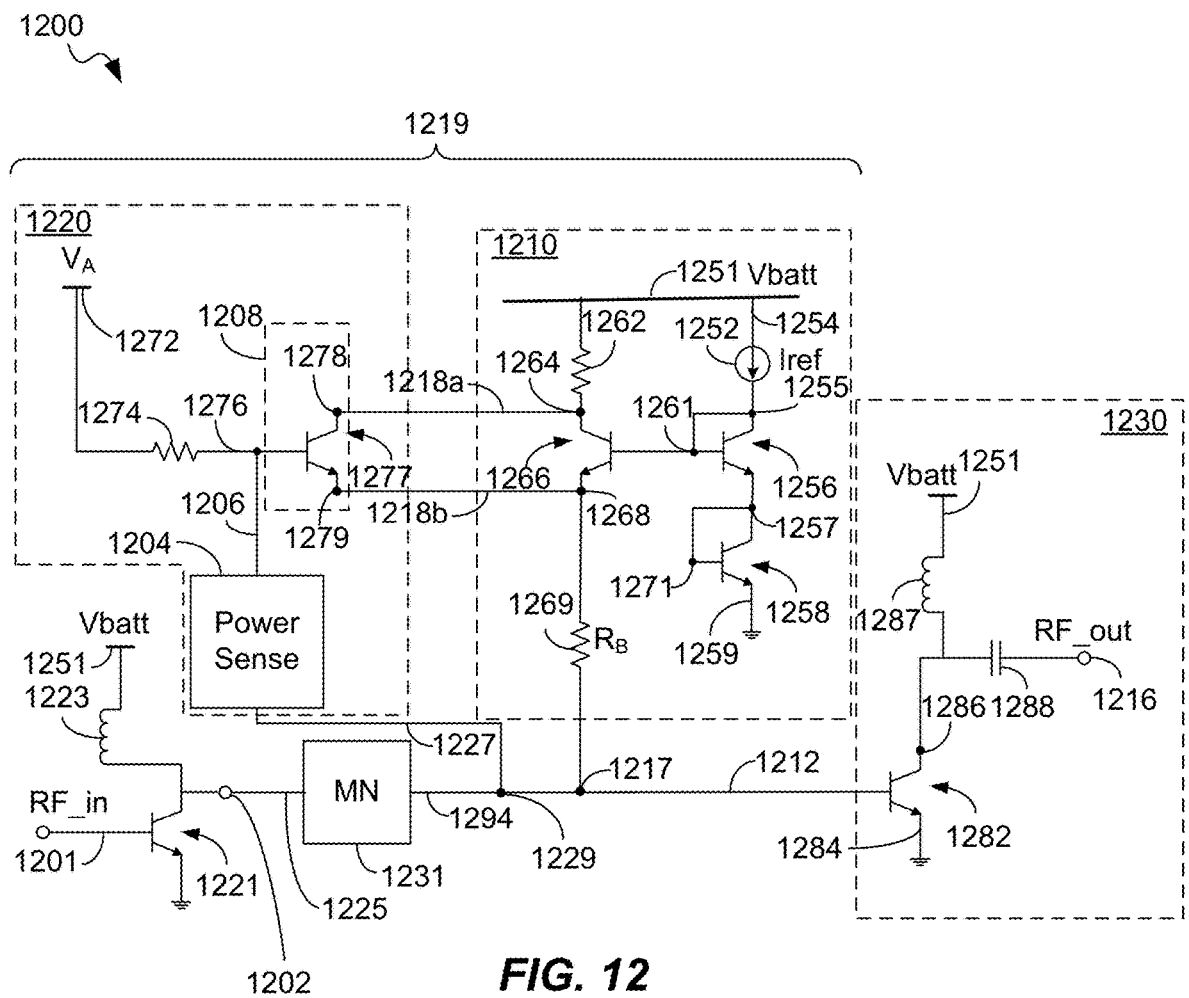
FIG. 12 is a schematic diagram illustrating an exemplary embodiment of an amplifier circuit in accordance with an exemplary embodiment of the disclosure.

FIG. 12 is a schematic diagram illustrating an exemplary embodiment of an amplifier circuit 1200. The amplifier circuit 1200 of FIG. 12 is an example implementation of the amplifier circuit 300 of FIG. 3, the amplifier circuit 400 of FIG. 4 and the amplifier circuit 1000 of FIG. 10. Elements in FIG. 12 that are similar to corresponding elements in FIG. 3, FIG. 4 and FIG. 10 will be labeled using the nomenclature 12XX, where an element in FIG. 12 labeled 12XX is similar to an element in FIG. 3 labeled 3XX, an element in FIG. 4 labeled 4XX or an element in FIG. 10 labeled 10XX. For example, the dynamic bias adjustment circuit 1220 in FIG. 12 is similar to, and is an exemplary embodiment of the dynamic bias adjustment circuit 320 in FIG. 3, the dynamic bias adjustment circuit 420 in FIG. 4 and the dynamic bias adjustment circuit 1020 in FIG. 10.

In FIG. 12, the power sense circuit 1204 is implemented using any RF coupled path and may be coupled to the base of the transistor 1277 at node 1276 and may be coupled to a node 1229. A resistor 1274 may also be coupled to the node 1276 and may be coupled to a voltage, $V_A$, on connection 1272 (as illustrated) or to the base of the transistor 1258, for example.

In the example shown in FIG. 12, an input signal 1201, "in", is provided to the base of a transistor 1221. The RF input node 1202 is provided at the collector of the transistor 1221. The collector of the transistor 1221 is also coupled to the battery voltage, Vbatt 1251 through an inductor 1223. The collector of the transistor 1221 is also coupled to the connection 1225, which also forms the input to a matching network 1231. In this exemplary embodiment, the transistor 1221 represents a previous amplifier stage, such as, for example, an intermediate amplifier or a driver amplifier stage, as mentioned herein. In some embodiments, the previous amplifier stage is implemented using the same process, for example on the same (e.g., GaAs or GaN) die as the amplifier 1230.

An output of the matching network 1231 may be provided over connection 1294 to the power sense circuit 1204 and to the base of the transistor 1282. In the exemplary embodiment shown in FIG. 12, the connection 1227 to the node 1229 illustrates an example of the power sense circuit 1204 being coupled to the output of the matching network 1231. In an exemplary embodiment, the matching network 1231 may comprise one or more capacitors or inductors, or a combination thereof, coupled in series, parallel, or a combination of series and parallel. In the exemplary embodiment shown in FIG. 12, the power sense element 1204 is coupled to the node 1229 after the matching network 1231. In the example shown in FIG. 12, a separate ballast capacitor, $C_B$, (FIG. 4 and FIGS. 6-9) may be omitted and its functionality included in the matching network 1231.

Figure 13:
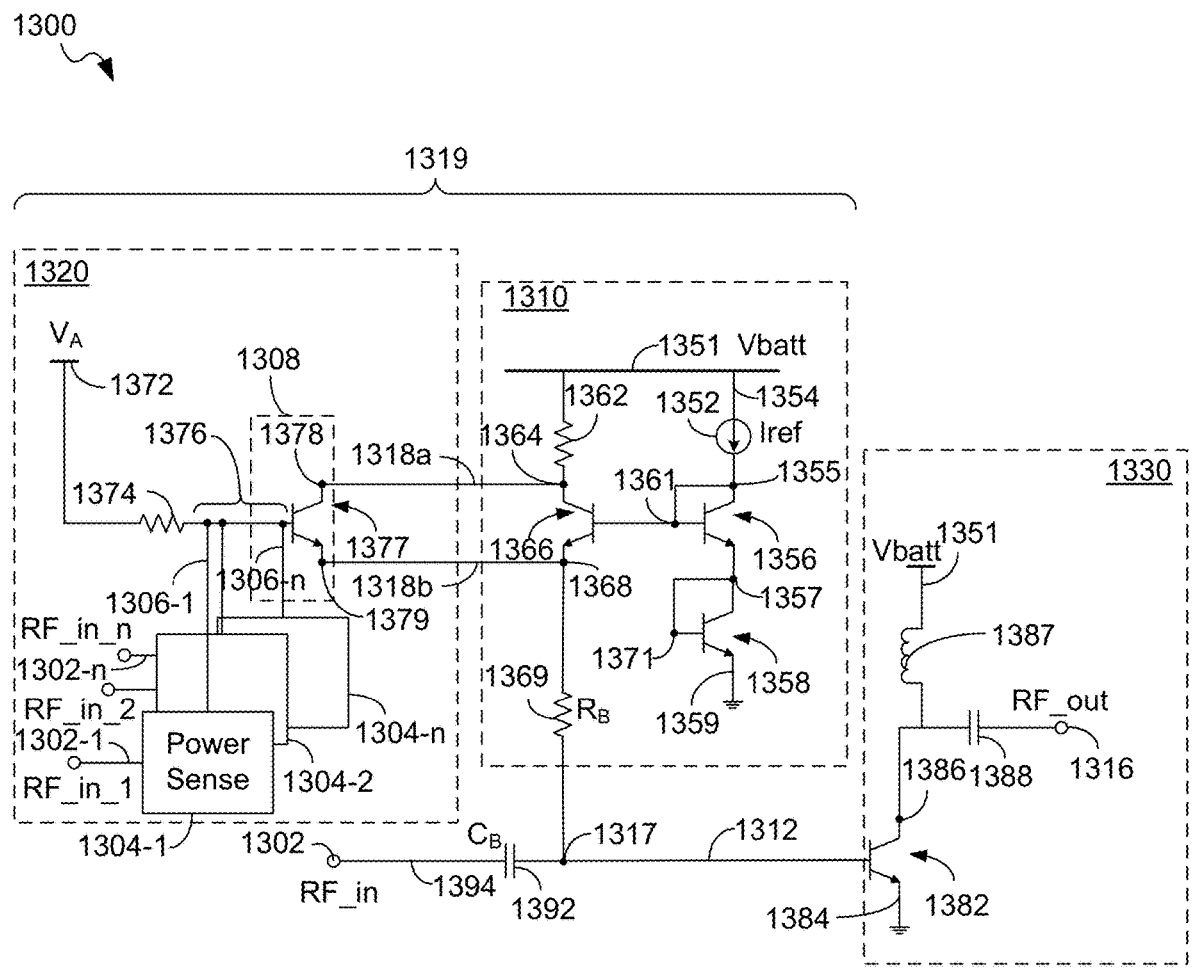
FIG. 13 is a schematic diagram illustrating an exemplary embodiment of an amplifier circuit in accordance with an exemplary embodiment of the disclosure.

FIG. 13 is a schematic diagram illustrating an exemplary embodiment of an amplifier circuit 1300. The amplifier circuit 1300 of FIG. 13 is an example implementation of the amplifier circuit 300 of FIG. 3 and the amplifier circuit 400 of FIG. 4. Elements in FIG. 13 that are similar to corresponding elements in FIG. 3 and FIG. 4 will be labeled using the nomenclature 13XX, where an element in FIG. 13 labeled 13XX is similar to an element in FIG. 3 labeled 3XX or an element in FIG. 4 labeled 4XX. For example, the dynamic bias adjustment circuit 1320 in FIG. 13 is similar to, and is an exemplary embodiment of the dynamic bias adjustment circuit 320 in FIG. 3 and the dynamic bias adjustment circuit 420 in FIG. 4.

In FIG. 13, multiple instances of the power sense circuit 1304, labeled 1304-1, 1304-2 through 1304-n, may be implemented using any RF coupled path. Each instance 1304-1 through 1304-n of the power sense circuit may be coupled to the base of the transistor 1377 at node 1376 over respective connections 1306-1, 1306-2 (not shown), 1306-n, and may be coupled to respective multiple instances of RF input signals, shown as RF_in_1 through RF_in_n in FIG. 13. A resistor 1374 may also be coupled to the node 1376 and may be coupled to a voltage, $V_A$, on connection 1372. The node 1302 represents the main RF input signal node, while the inputs RF_in_1 through RF_in_n may be coupled to respective input terminals 1302-1 through 1302-n. In other embodiments, multiple power sense circuits 1304 are coupled to respective resistors and respective voltages instead of being coupled to a common voltage, $V_A$. In some embodiments, multiple power sense circuits 1304 are coupled to respective transistors 1377, which may be coupled to a common main bias circuit 310 or to respective main bias circuits 310.

In the exemplary embodiment shown in FIG. 13, the power sense circuits 1304-1 through 1304-n illustrate that it is possible to have multiple input power points. For example, RF_in_1 can be connected to the node (1003, FIG. 10) in front of the matching network 1031 (not shown) of FIG. 10, RF_in_2 can be connected to the matching network 1131 (FIG. 11), and RF_in_n can be connected to the node 1229 after the matching network 1231 (FIG. 12). Other combinations are also possible. For example, in some embodiments multiple power sense circuits 1304 are coupled to respective sources of an RF input signal. In some such embodiments, the circuit 1300 is configured such that different transmit signals (e.g., different frequencies, RAT, encoding, etc.) are conditioned separately for transmission. In some embodiments, a single source of an RF input signal is selectively coupled to one or more of the power sense circuits 1304, or is coupled to multiple power sense circuits 1304 and the multiple power sense circuits are selectively coupled to the node 1376, for example via one or more switches (not illustrated). In some such embodiments, the circuit 1300 is configured such that the RF input signal from the single source may be transmitted using different biases, for example based on a desired signal characteristic of the signal being transmitted.

Figure 14:
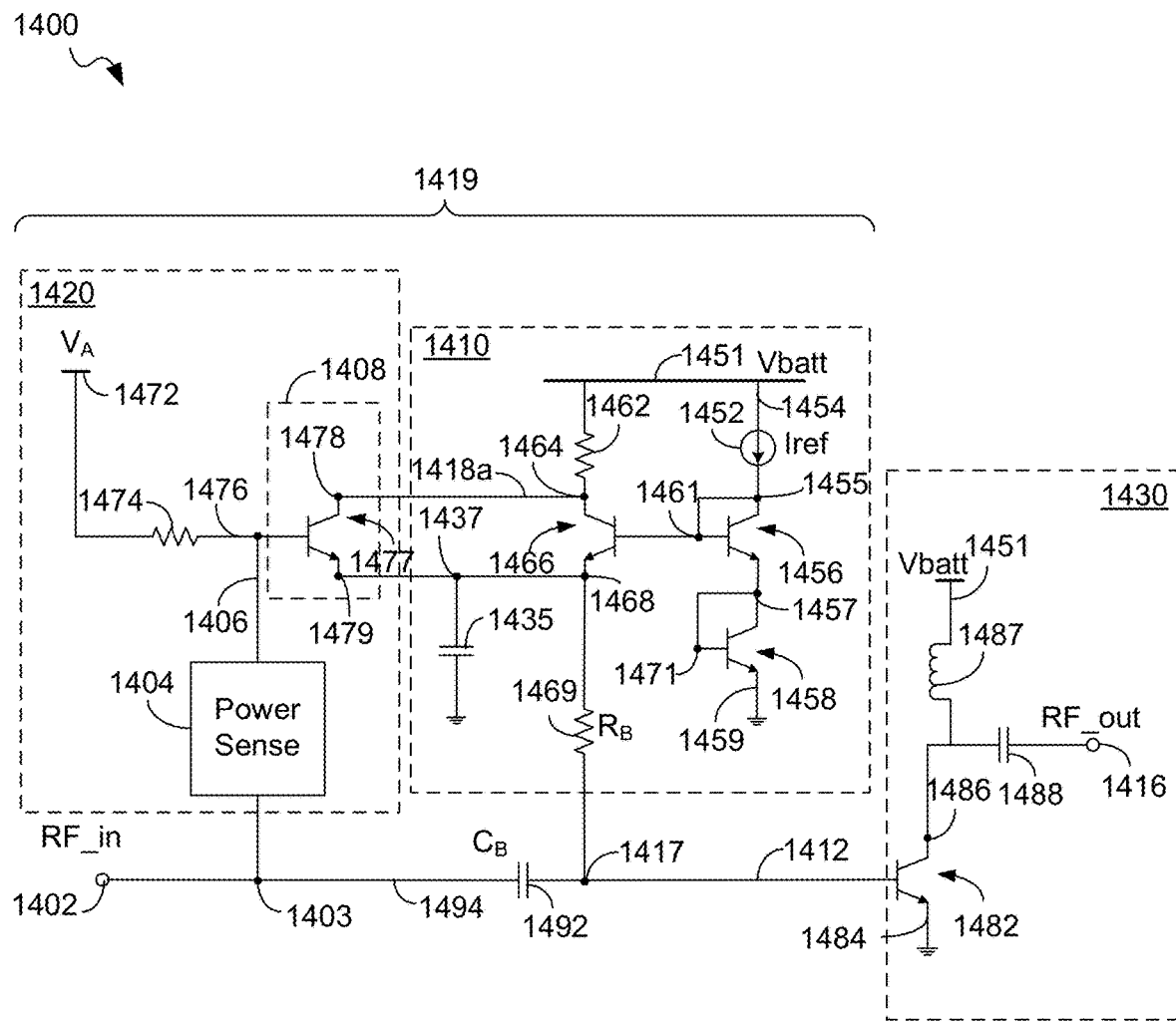
FIG. 14 is a schematic diagram illustrating an exemplary embodiment of an amplifier circuit in accordance with an exemplary embodiment of the disclosure.

FIG. 14 is a schematic diagram illustrating an exemplary embodiment of an amplifier circuit 1400. The amplifier circuit 1400 of FIG. 14 is an example implementation of the amplifier circuit 300 of FIG. 3 and the amplifier circuit 400 of FIG. 4. Elements in FIG. 14 that are similar to corresponding elements in FIG. 3 and FIG. 4 will be labeled using the nomenclature 14XX, where an element in FIG. 14 labeled 14XX is similar to an element in FIG. 3 labeled 3XX or an element in FIG. 4 labeled 4XX. For example, the dynamic bias adjustment circuit 1420 in FIG. 14 is similar to, and is an exemplary embodiment of the dynamic bias adjustment circuit 320 in FIG. 3 and the dynamic bias adjustment circuit 420 in FIG. 4.

In FIG. 14, the power sense circuit 1404 is implemented using any RF coupled path and may be coupled to the base of the transistor 1477 at node 1476 over connection 1406 and may be coupled to the node 1403 and may be configured to receive the RF input signal on connection 1402. A resistor 1474 may also be coupled to the node 1476 and may be coupled to a voltage, $V_A$, on connection 1472 (as illustrated) or to the base of the transistor 1458, for example.

In an exemplary embodiment, a capacitor 1435 may be coupled to the emitter 1479 of the transistor 1477 and to the emitter 1468 of the transistor 1466 at node 1437 forming a shunt connection to ground. The capacitor may also be coupled to a system ground. The capacitor may be configured to adjust the bias current response provided by the transistor 1477 and the transistor 1466, and may also increase the stability of the amplifier circuit 1400 in some embodiments.

Figure 15:
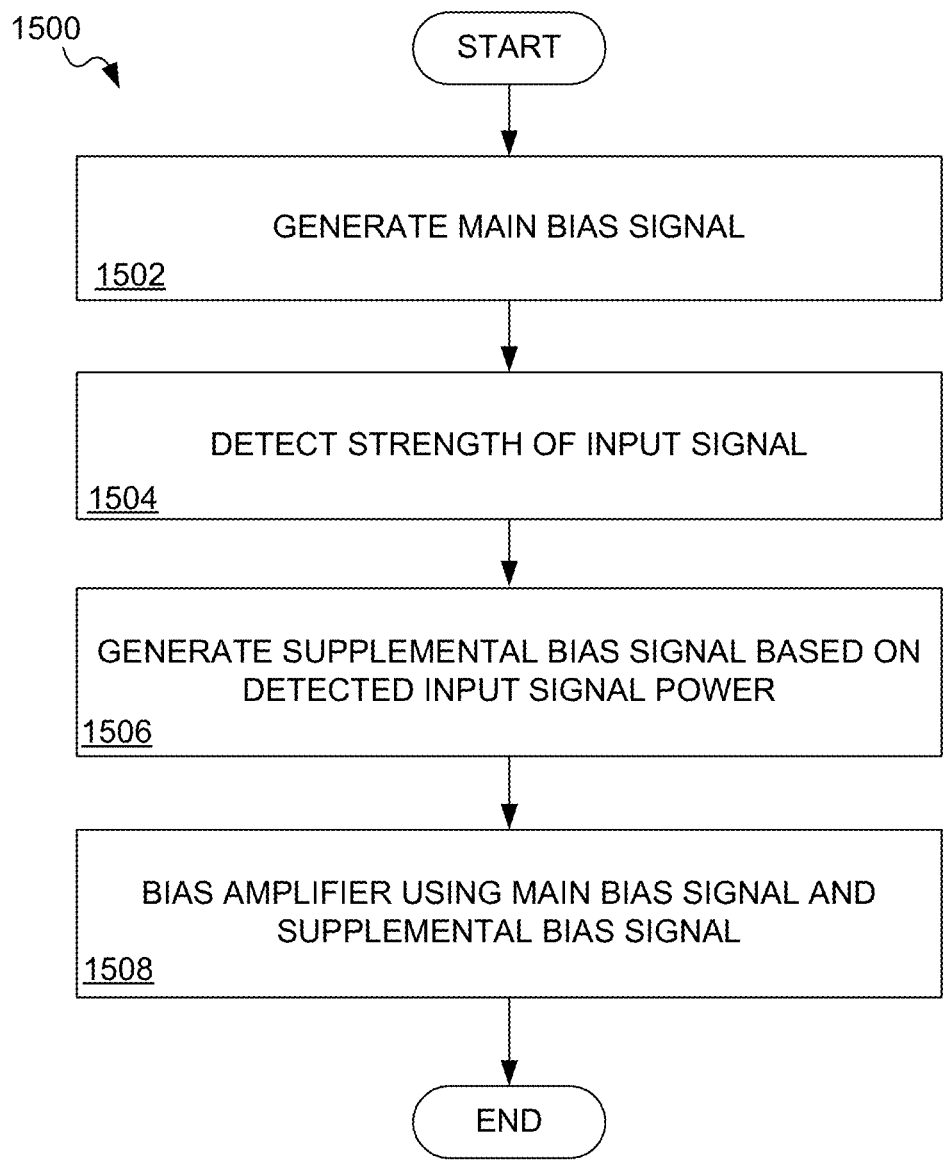
FIG. 15 is a flow chart describing the operation of an exemplary embodiment of an amplifier circuit in accordance with an exemplary embodiment of the disclosure.

FIG. 15 is a flow chart 1500 describing the operation of an exemplary embodiment of an amplifier circuit in accordance with an exemplary embodiment of the disclosure. The blocks in the method 1500 can be performed in or out of the order shown, and in some embodiments, can be performed at least in part in parallel.

In block 1502, a main initial bias signal may be generated. For example, the main bias circuit 410 (or any alternative embodiment of the main bias circuit 410) may generate a main bias signal for the amplifier 430.

In block 1504, the signal strength of an input signal is detected. For example, the power sense circuit 404 (FIG. 4) may detect and determine the strength of an RF input signal on connection 402.

In block 1506, an additional, or supplemental bias signal may be generated based on the strength of the input signal detected in block 1504. For example, the dynamic bias adjustment circuit 420 (FIG. 4) may generate an additional or supplemental bias current signal to be provided to the amplifier 430 based on the strength of the RF input signal on connection 402 detected in block 1504.

In block 1508, an amplifier may be biased using the main bias signal supplemented by the additional, or supplemental bias signal generated in block 1506. For example, an amplifier 430 may receive a main bias signal from the main bias circuit 410 and may also receive additional bias current from the dynamic bias adjustment circuit 420 (FIG. 4). The amplifier (e.g., the amplifier 430) may amplify the input signal based on the main bias signal and the supplemental bias signal.

Figure 16:
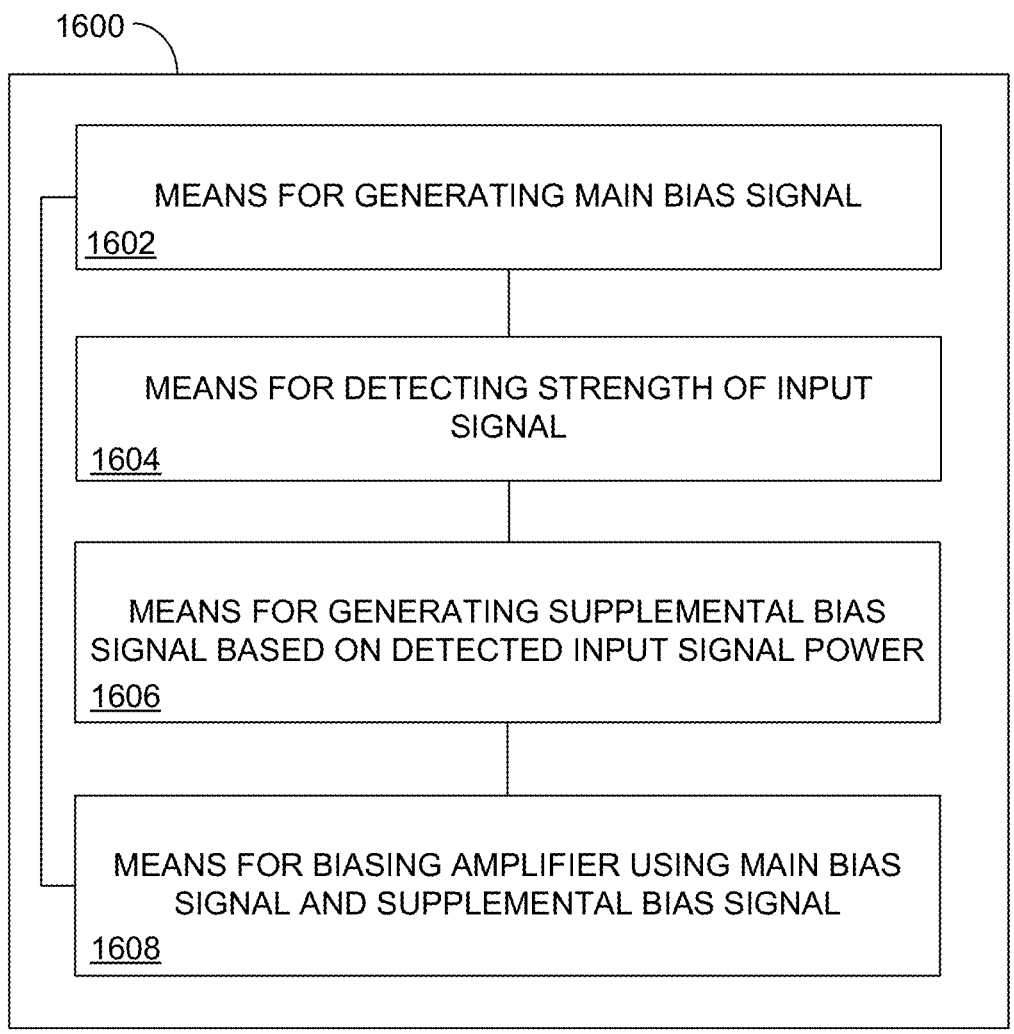
FIG. 16 is a functional block diagram of an apparatus for an amplifier circuit in accordance with an exemplary embodiment of the disclosure.

FIG. 16 is a functional block diagram of an apparatus 1600 for an amplifier circuit in accordance with an exemplary embodiment of the disclosure. The apparatus 1600 comprises means 1602 for generating a main bias signal. In certain embodiments, the means 1602 for generating a main bias signal can be configured to perform one or more of the functions described in operation block 1502 of method 1500 (FIG. 15). In an exemplary embodiment, the means 1602 for generating a main bias signal may comprise the main bias circuit 410 (or any alternative embodiment of the main bias circuit 410) generating a main bias signal.

The apparatus 1600 further comprises means 1604 for detecting the signal strength of an input signal. In certain embodiments, the means 1604 for detecting the signal strength of an input signal can be configured to perform one or more of the functions described in operation block 1504 of method 1500 (FIG. 15). In an exemplary embodiment, the means 1604 for detecting the signal strength of an input signal may comprise the power sense circuit 404 (FIG. 4) detecting and determining the strength of an RF input signal.

The apparatus 1600 further comprises means 1606 for generating a supplemental bias signal based on the strength of the input signal. In certain embodiments, the means 1606 for generating a supplemental bias signal based on the strength of the input signal can be configured to perform one or more of the functions described in operation block 1506 of method 1500 (FIG. 15). In an exemplary embodiment, the means 1606 for generating a supplemental bias signal based on the strength of the input signal may comprise the dynamic bias adjustment circuit 420 (FIG. 4) generating a supplemental bias signal based on the strength of the RF input signal.

The apparatus 1600 further comprises means 1608 for biasing using the main bias signal supplemented by the supplemental bias signal. In certain embodiments, the means 1608 for biasing using the main bias signal supplemented by the supplemental bias signal can be configured to perform one or more of the functions described in operation block 1508 of method 1500 (FIG. 15). In an exemplary embodiment, the means 1608 for biasing using the main bias signal supplemented by the supplemental bias signal may comprise the connection 412 (FIG. 4), for example as coupled to a means for amplifying. Thus, the means 1608 for biasing may be coupled to a means for amplifying and the apparatus 1600 may further comprise the means for amplifying, for example the amplifier 430 (FIG. 4). The means for amplifying may comprise means for amplifying the input signal based on the main bias signal and the supplemental bias signal.

The amplifier circuit described herein may be implemented on one or more ICs, analog ICs, RFICs, mixed-signal ICs, ASICs, printed circuit boards (PCBs), electronic devices, etc. The amplifier circuit described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier circuit described herein described herein may be a stand-alone device or may be part of a larger device. A device may be (i) a stand-alone IC, (ii) a set of one or more ICs that may include memory ICs for storing data and/or instructions, (iii) an RFIC such as an RF receiver (RPR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. An amplifier circuit, comprising:
an amplifier configured to receive a radio frequency (RF) input signal from one or more input nodes;
a bias circuit comprising a reference transistor coupled between a reference current source and ground, and a bias transistor coupled to the reference transistor and configured to generate a main bias current to bias the amplifier;
an input power sense circuit coupled to the one or more input nodes; and
an additional transistor coupled to the input power sense circuit and to the bias transistor, the additional transistor configured to generate an additional bias current to bias the amplifier, the additional bias current responsive to a power level of the RF input signal, wherein the input power sense circuit comprises a plurality of RF coupled paths between the base of the additional transistor and the one or more input nodes.

2. The amplifier circuit of claim 1, further comprising a second reference transistor coupled between the reference transistor and ground, wherein a collector of the additional transistor is coupled to a collector of the bias transistor, an emitter of the additional transistor is coupled to an emitter of the bias transistor, a base of the additional transistor is coupled to a base of the second reference transistor, and the input power sense circuit comprises a capacitance coupled between the base of the additional transistor and the one or more input nodes.

3. The amplifier circuit of claim 1, wherein a collector of the additional transistor is coupled to a battery voltage through a first impedance circuit, an emitter of the additional transistor is coupled to an emitter of the bias transistor through a second impedance circuit, and a base of the additional transistor is coupled to a voltage source.

4. The amplifier circuit of claim 1, wherein a collector of the additional transistor is coupled to a battery voltage, an emitter of the additional transistor is coupled to the input node through a ballast capacitance, and a base of the additional transistor is coupled to a voltage source.

5. The amplifier circuit of claim 1, further comprising a matching circuit between the input node and the amplifier, wherein a collector of the additional transistor is coupled to a collector of the bias transistor, an emitter of the additional transistor is coupled to an emitter of the bias transistor, and a base of the additional transistor is coupled to a voltage source.

6. The amplifier circuit of claim 1, further comprising a matching circuit between the one or more input nodes and the amplifier, wherein a collector of the additional transistor is coupled to a collector of the bias transistor, an emitter of the additional transistor is coupled to an emitter of the bias transistor, a base of the additional transistor is coupled to a voltage source, and the input power sense circuit comprises at least one of the plurality of RF coupled paths between the base of the additional transistor and an internal node of the matching circuit.

7. The amplifier circuit of claim 1, further comprising a matching circuit between the one or more input nodes and the amplifier, wherein a collector of the additional transistor is coupled to a collector of the bias transistor, an emitter of the additional transistor is coupled to an emitter of the bias transistor, a base of the additional transistor is coupled to a voltage source, and the input power sense circuit comprises at least one of the plurality of RF coupled paths between the base of the additional transistor and an output of the matching circuit.

8. The amplifier circuit of claim 1, wherein a collector of the additional transistor is coupled to a collector of the bias transistor, an emitter of the additional transistor is coupled to an emitter of the bias transistor and to a capacitor, and a base of the additional transistor is coupled to a voltage source.

9. The amplifier circuit of claim 1, further comprising a second amplifier, wherein the one or more are input node is coupled to an output of the second amplifier, wherein the amplifier and the second amplifier are fabricated using BJT technology on a same gallium arsenide or gallium nitride die.

10. A circuit, comprising:
- a power amplifier comprising a first transistor, a collector of the first transistor coupled to an output of the power amplifier, an emitter of the first transistor coupled to ground, and a base of the first transistor coupled to a source of a radio frequency input signal;
- a bias circuit comprising a second transistor, a collector of the second transistor coupled to a first voltage source, and an emitter of the second transistor coupled to the base of the first transistor; and
- a third transistor, a collector of the third transistor coupled to the first voltage source, an emitter of the third transistor coupled to the base of the first transistor, and a base of the third transistor coupled to the source of the radio frequency input signal.

11. The circuit of claim 10, wherein the base of the third transistor is directly coupled to the source of the radio frequency input signal.

12. The circuit of claim 10, wherein the base of the third transistor is coupled to the source of the radio frequency input signal via a capacitor.

13. The circuit of claim 12, wherein the collector of the third transistor is directly connected to the first voltage source.

14. The circuit of claim 12, wherein the collector of the third transistor is directly connected to the collector of the second transistor.

15. The circuit of claim 14, wherein the emitter of the third transistor is directly connected to the base of the first transistor.

16. The circuit of claim 14, wherein the emitter of the third transistor is directly connected to the emitter of the second transistor.

17. The circuit of claim 16, wherein a base of the second transistor is coupled to a base of a fourth transistor, the base of the fourth transistor further coupled to a collector of the fourth transistor, and the collector of the fourth transistor further coupled to a current source.

18. The circuit of claim 17, further comprising a fifth transistor, a collector and a base of the fifth transistor coupled to an emitter of the fourth transistor, the base of the fifth transistor further coupled to the base of the third transistor.

19. The circuit of claim 17, wherein the base of the third transistor is coupled to a second voltage source.

* * * * *